US012777590B2

(12) United States Patent
Hamilton et al.

(10) Patent No.: US 12,777,590 B2
(45) Date of Patent: Oct. 27, 2026

(54) THIN-FILM COMPONENTS INTEGRATED ONTO FLEX CIRCUIT BOARDS

(71) Applicant: Google LLC, Mountain View, CA (US)

(72) Inventors: Michael Clayton Hamilton, Santa Barbara, CA (US); Bob Benjamin Buckley, Santa Barbara, CA (US); George Earl Grant Sterling, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 208 days.

(21) Appl. No.: 18/826,435

(22) Filed: Sep. 6, 2024

(65) Prior Publication Data

US 2026/0075719 A1 Mar. 12, 2026

(51) Int. Cl.
*H05K 1/189* (2026.01)
*G06N 10/40* (2022.01)
(Continued)

(52) U.S. Cl.
CPC ............. *H05K 1/189* (2013.01); *G06N 10/40* (2022.01); *H05K 1/0393* (2013.01); *H05K 1/09* (2013.01);
(Continued)

(58) Field of Classification Search
CPC ...... H05K 1/02; H05K 1/0218; H05K 1/0219; H05K 1/024; H05K 1/0243; H05K 1/0393;
(Continued)

(56) References Cited

U.S. PATENT DOCUMENTS 6,930,240 B1 8/2005 Giboney et al.
9,348,377 B2 5/2016 Dean et al.
(Continued)

FOREIGN PATENT DOCUMENTS

CN 206452600 8/2017
CN 110933836 3/2020
(Continued)

OTHER PUBLICATIONS

Chinese Search Report Corresponding to Application No. 2021800762408 on Oct. 12, 2023.
(Continued)

*Primary Examiner* — Thai Pham
(74) *Attorney, Agent, or Firm* — DORITY & MANNING, P.A.

(57) ABSTRACT

A signal line assembly can include a flex circuit board. The flex circuit board can include at least one first ground layer; at least one first dielectric layer disposed on an inner surface of the at least one first ground layer; and a plurality of first signal lines disposed on an inner surface of the at least one first dielectric layer. The flex circuit board can have a cutout section. The signal line assembly can include a film structure disposed in the cutout section. The film structure can include at least one second ground layer; at least one second dielectric layer; and a plurality of second signal lines respectively coupled to the plurality of first signal lines. The at least one second dielectric layer can have a thickness that is smaller than a thickness of the at least one first dielectric layer.

20 Claims, 10 Drawing Sheets

(51) Int. Cl.
*H05K 1/03* (2006.01)
*H05K 1/09* (2006.01)

(52) U.S. Cl.
CPC ................ *H05K 2201/0154* (2013.01); *H05K 2201/09327* (2013.01); *H05K 2201/1006* (2013.01); *H05K 2201/10734* (2013.01)

(58) Field of Classification Search
CPC .......... H05K 1/09; H05K 1/115; H05K 1/147; H05K 1/189; H05K 2201/0154; H05K 2201/09327; H05K 2201/1006; H05K 2201/10734; G06N 10/00; G06N 10/20; G06N 10/40; G06N 10/80
See application file for complete search history.

(56) References Cited

U.S. PATENT DOCUMENTS

| | | | | |
|---|---|---|---|---|
| 9,515,402 | B1 | 12/2016 | Li et al. | |
| 9,723,725 | B2 | 8/2017 | Shi | |
| 9,991,616 | B2 | 6/2018 | Axelowitz et al. | |
| 10,205,286 | B2 | 2/2019 | Provencher et al. | |
| 10,687,415 | B2 | 6/2020 | Zhang et al. | |
| 10,957,969 | B2 | 3/2021 | Pandya et al. | |
| 11,245,171 | B2 | 2/2022 | Yosui | |
| 11,557,709 | B2 | 1/2023 | Martinis | |
| 2003/0174484 | A1 | 9/2003 | Pai et al. | |
| 2004/0150970 | A1 | 8/2004 | Lee | |
| 2010/0157552 | A1 | 6/2010 | Thom et al. | |
| 2010/0331738 | A1 | 12/2010 | Stein et al. | |
| 2011/0024160 | A1 | 2/2011 | Quan et al. | |
| 2013/0327621 | A1 | 12/2013 | Dinh et al. | |
| 2014/0127916 | A1 | 5/2014 | Lee | |
| 2015/0327368 | A1 | 11/2015 | Su et al. | |
| 2016/0099227 | A1 | 4/2016 | Dalal et al. | |
| 2017/0093059 | A1 | 3/2017 | Chen et al. | |
| 2018/0294401 | A1 | 10/2018 | Tuckerman | |
| 2019/0043747 | A1 | 2/2019 | Malatkar et al. | |
| 2019/0341173 | A1 | 11/2019 | Smith et al. | |
| 2020/0076036 | A1* | 3/2020 | Iwata | H01P 3/10 |
| 2020/0194859 | A1* | 6/2020 | Araki | H05K 1/111 |
| 2020/0280117 | A1* | 9/2020 | Yosui | H01P 3/088 |
| 2021/0028346 | A1* | 1/2021 | Martinis | H01B 11/203 |
| 2022/0083893 | A1* | 3/2022 | Martinis | G06N 10/00 |
| 2022/0085527 | A1* | 3/2022 | Martinis | H01R 12/61 |
| 2022/0087012 | A1* | 3/2022 | Martinis | H05K 3/06 |
| 2023/0130578 | A1* | 4/2023 | Martinis | H01B 11/203 |

FOREIGN PATENT DOCUMENTS

| | | |
|---|---|---|
| JP | H 05299708 | 11/1993 |
| JP | H 05304224 | 11/1993 |
| JP | H 06523621 | 2/1994 |
| JP | 2009/266846 | 11/2009 |
| JP | 2009/266847 | 11/2009 |
| WO | WO 2018/213494 | 11/2018 |
| WO | WO 2019/050525 | 3/2019 |

OTHER PUBLICATIONS

Chow et al., "Pressure Contact Micro-Springs in Small Pitch Flip-Chip Packages", Institute of Electrical and Electronics Engineers Transactions on Components and Packaging Technologies, vol. 29, No. 4, pp. 796-803.

Deshpande et al., "Integrating High-Density Microwave Signalling and Packaging with Superconducting Qubits", 2019 IEEE/MTT-S International Microwave Symposium—IMS, Boston, Massachusetts, United States, Jun. 2, 2019, pp. 271-274.

International Preliminary Report on Patentability for Application No. PCT/US2021/050626, mailed Mar. 30, 2023, 9 pages.

International Preliminary Report on Patentability for Application No. PCT/US2021/050639, mailed Mar. 30, 2023, 8 pages.

International Search Report and Written Opinion for Application No. PCT/US2021/050626, mailed Dec. 23, 2021, 15 pages.

International Search Report and Written Opinion for Application No. PCT/US2021/050639, mailed Jan. 3, 2022, 13 pages.

Laird.com, "Flexible Foam Sheet Broadband Microwave Absorber", https://www.laird.com/sites/default/files/2021-01/RFP-DS-AN%2006242020.pdf, retrieved on Jan. 19, 2022, 2 pages.

Shubin et al., "Novel Packaging with Rematable Spring Interconnect Chips for MCM", Fifty-Ninth Electronic Components and Technology Conference, San Diego, California, United States, May 26-29, 2009, 7 pages.

* cited by examiner

THIN-FILM COMPONENTS INTEGRATED ONTO FLEX CIRCUIT BOARDS

FIELD

The present disclosure relates generally to systems and methods for quantum computing.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a ¿ 0 〉+b ¿ 1〉 The "0" and "1" states of a digital computer are analogous to the ¿ 0〉 and ¿ 1〉 basis states, respectively of a qubit.

SUMMARY

Aspects and advantages of embodiments of the present disclosure will be set forth in part in the following description, or can be learned from the description, or can be learned through practice of the embodiments.

Example aspects of the present disclosure provide an example signal line assembly. In some implementations, the example signal line assembly can include an example flex circuit board. In the example signal line assembly, the example flex circuit board can include at least one first ground layer. In the example signal line assembly, the example flex circuit board can include at least one first dielectric layer disposed on an inner surface of the at least one first ground layer. In the example signal line assembly, the first dielectric layer can have a first thickness. In the example signal line assembly, the example flex circuit board can include a plurality of first signal lines disposed on an inner surface of the at least one first dielectric layer. In the example signal line assembly, the example flex circuit board can include at least one cutout section. In some implementations, the example signal line assembly can include an example film structure. In the example signal line assembly, the example film structure can be disposed in the cutout section. In the example signal line assembly, the example film structure can include at least one second ground layer. In the example signal line assembly, the example film structure can include at least one second dielectric layer. In the example signal line assembly, the at least one second dielectric layer can have a second thickness that is smaller than the first thickness. In the example signal line assembly, the example film structure can include a plurality of second signal lines respectively coupled to the plurality of first signal lines.

Example aspects of the present disclosure provide an example quantum computing system. In some implementations, the example quantum computing system can include a plurality of qubits. In some implementations, the example quantum computing system can include a quantum logic circuit configured to perform one or more quantum operations on the plurality of qubits. In some implementations, the example quantum computing system can include an example signal line assembly. In some implementations, the example signal line assembly can include an example flex circuit board. In the example signal line assembly, the example flex circuit board can include at least one first ground layer. In the example signal line assembly, the example flex circuit board can include at least one first dielectric layer disposed on an inner surface of the at least one first ground layer. In the example signal line assembly, the first dielectric layer can have a first thickness. In the example signal line assembly, the example flex circuit board can include a plurality of first signal lines disposed on an inner surface of the at least one first dielectric layer. In the example signal line assembly, the example flex circuit board can include at least one cutout section. In some implementations, the example signal line assembly can include an example film structure. In the example signal line assembly, the example film structure can be disposed in the cutout section. In the example signal line assembly, the example film structure can include at least one second ground layer. In the example signal line assembly, the example film structure can include at least one second dielectric layer. In the example signal line assembly, the at least one second dielectric layer can have a second thickness that is smaller than the first thickness. In the example signal line assembly, the example film structure can include a plurality of second signal lines respectively coupled to the plurality of first signal lines.

Example aspects of the present disclosure provide an example method. In some implementations, the example method can include fabricating a flex circuit board. In the example method, the example flex circuit board can include at least one first ground layer. In the example method, the example flex circuit board can include at least one first dielectric layer disposed on an inner surface of the at least one first ground layer. In the example method, the first dielectric layer can have a first thickness. In the example signal line assembly, the example flex circuit board can include a plurality of first signal lines disposed on an inner surface of the at least one first dielectric layer. In the example method, the flex circuit board can include at least one cutout section. In some implementations, the example method can include fabricating a film structure. In the example method, the example film structure can include at least one second ground layer. In the example method, the example film structure can include at least one second dielectric layer. In the example method, the at least one second dielectric layer can have a second thickness that is smaller than the first thickness. In the example method, the example film structure can include a plurality of second signal lines respectively coupled to the plurality of first signal lines. In some implementations, the example method can include applying one or more bump bonds to the flex circuit board. In some implementations, the example method can include coupling the film structure to the flex circuit board via the one or more bump bonds.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
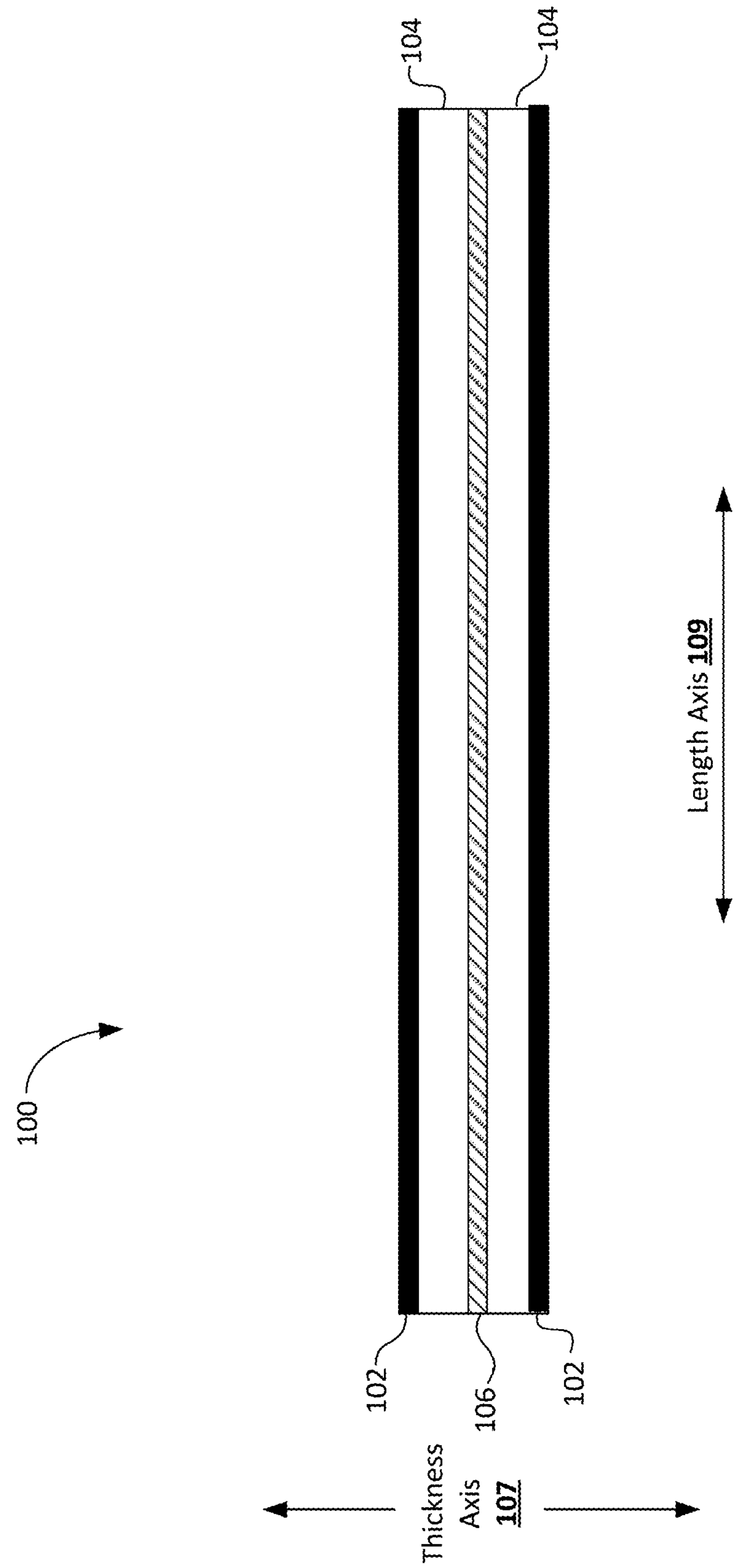
FIG. 1 depicts a cross-sectional view of a portion of an example signal line assembly comprising a flex circuit board according to some aspects of the present disclosure.

Example embodiments according to some aspects of the present disclosure are directed to signal line assemblies for use in quantum computing systems and methods. A signal line assembly can include a flex circuit board having a plurality of signal lines in a stripline configuration, with two ground layers; two dielectric layers between the two ground layers; and a plurality of signal lines between the two dielectric layers. The flex circuit board can have one or more cutout sections, with one or more thin-film structures bridging the cutout sections. For example, a thin-film structure can have a stripline configuration, with two ground layers, two dielectric layers (e.g., thin-film polyimide layers) between the ground layers, and a plurality of signal lines between the two dielectric layers. Each signal line and ground layer of the thin-film structure can be electrically coupled at each end to a corresponding signal line or ground layer of the flex circuit board, thereby providing a plurality of electrical connections across the cutout section.

In some instances, the flex circuit board can have, at each cutout section, a thin edge frame to provide structural support to the signal line assembly, along with a center cutout section that can be empty. In some instances, the edge frame can lack any metal components to reduce thermal conductivity across the cutout section (e.g., in order to provide a thermal break in a signal line assembly disposed in a cryogenic chamber). For example, in some instances, the edge frame can comprise a low-thermal-conductivity dielectric material, which can be the same as or different from a material of the dielectric layers throughout a remainder of the flex circuit board. In some instances, a width of the edge frame can be small to limit thermal conductivity, while still being wide enough to provide structural support to the thin-film structure or flex circuit board across the cutout section. For example, in some instances, a flex circuit board can have a total width of about 35 mm, with a cutout section having a width of 25 to 30 mm, such that each side of an edge frame may have a width between about 2.5 and 5 mm.

In some instances, the thin-film structure can have a thickness that is significantly thinner than a thickness of the flex circuit board, such as about one tenth the thickness of the flex circuit board. For example, in some instances, a flex circuit board can have a total thickness of hundreds of micrometers, such as about 250 micrometers, while a thin-film structure can have a total thickness of tens of micrometers, such as about 25 micrometers. In some instances, a thickness of one or more electrical conductors of the thin-film structure (e.g., ground layers, signal lines, etc.) can be smaller than a thickness of a corresponding conductor of the flex circuit board, such as hundreds of nanometers (e.g., about 250 nm, etc.). In some instances, a thickness or cross-sectional area of the thin-film structure or component thereof (e.g., electrical conductor, etc.) can be small to limit thermal conductivity of the thin-film structure, while still being large enough to provide acceptable manufacturing yield or avoid damage (e.g., splitting, tearing, breakage, etc.) to the signal line assembly.

In some instances, a thin-film structure can include one or more signal conditioning structures, such as filters, attenuators, or thermalization structures. For example, in some instances, a thin-film structure can include one or more filters, such as a plurality of filters respectively coupled to each of a plurality of signal lines. In some instances, a filter can be photolithographically defined. In some instances, a signal conditioning structure can include one or more absorptive or reflective materials configured to attenuate infrared signals. Other signal conditioning structures are possible, such as attenuators (e.g., photolithographically defined attenuators, etc.), thermalization structures (e.g., photolithographically defined thermalization structures), and the like.

In some instances, signal lines and ground layers of the flex circuit board or thin-film structure can include superconducting materials (e.g., niobium, etc.) or non-superconducting materials (e.g., copper, etc.). For example, in some instances, signal lines and ground layers of the flex circuit board or thin-film structure can include superconducting materials that become superconducting at a temperature below about 10 Kelvin (e.g., below about 3 Kelvin, such as below about 1 Kelvin, etc.). In some instances, a signal line can include a niobium signal trace with an aluminum barrier layer between the signal line and the dielectric layers.

In some instances, a signal line assembly can be fabricated by fabricating a flex circuit board and corresponding thin-film structure separately; cutting a cutout section in the flex circuit board; and attaching the thin-film structure to the flex circuit board using a flip-chip method. For example, a plurality of bump bonds (e.g., indium bumps, etc.) can be applied to the flex circuit board (e.g., to each of the signal lines and ground layers of the flex circuit board), and the thin-film structure can be coupled to the flex circuit board via the bump bonds. In some instances, the flex circuit board or thin-film structure can include one or more vias to electrically couple a signal line to a surface of the flex circuit board or thin-film structure, such that a bump bond can be electrically coupled to the signal line by means of the via. In some instances, the flex circuit board or thin-film structure can include one or more signal pads (e.g., signal pads coupled to one or more corresponding vias), and the bump bonds can be applied to the signal pads. In some instances, underfill can be used to stabilize the bump bonds.

Additionally, systems and methods according to example aspects of the present disclosure can provide for quantum computing systems (e.g., cryogenic quantum computing systems) having a variety of characteristics, such as quantum computing systems having one or more signal line assemblies with thin-film structures according to some aspects of the present disclosure. A quantum computing system can include quantum hardware in data communication with one or more classical processor(s). In some instances, a quantum computing system can include a chamber mount configured to support the quantum hardware and a vacuum chamber configured to receive the chamber mount and dispose the quantum hardware in a vacuum. The vacuum chamber can form a cooling gradient from an end of the vacuum chamber to the quantum hardware. For example, the vacuum chamber can form a cooling gradient from a first temperature, such as room temperature (e.g., about 300 kelvin) to a second temperature, such as at or about absolute zero (e.g., about 10 millikelvin), such as to provide a temperature at the quantum hardware at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator. Additional example details of an example cryogenic quantum computing system and example vacuum chamber are further provided below with respect to FIG. 7.

Example embodiments according to some aspects of the present disclosure can provide for a number of technical effects and benefits, such as improvements to computing technology (e.g., quantum computing technology). For example, in some instances, example embodiments according to some aspects of the present disclosure can provide for improved thermal properties of a signal line assembly (e.g., signal line assembly installed in a cryogenic quantum computing system) compared to some alternative implementations by providing thermal breaks in the signal line assembly. As another example, in some instances, example embodiments according to some aspects of the present disclosure can provide for improved structural integrity, manufacturing yield, or other benefits compared to some alternative implementations (e.g., pure thin-film assemblies, etc.). As another example, in some instances, example embodiments according to some aspects of the present disclosure can provide more compact or higher-density signal conditioning structures (e.g., filters, attenuators, thermalization structures, etc.) compared to some alternative implementations. Additionally, improved density or compactness can in some instances provide improved scalability of quantum computing systems compared to some alternative implementations.

In some instances, example embodiments according to some aspects of the present disclosure can provide for improved thermal properties of a signal line assembly (e.g., signal line assembly installed in a cryogenic quantum computing system) compared to some alternative implementations by providing thermal breaks in the signal line assembly. For example, in some cryogenic systems, a signal line assembly may pass through a plurality of cryogenic chambers or subchambers having a plurality of temperatures ranging from less than about 10 Kelvin (e.g., less than about 3 Kelvin, such as less than about 1 Kelvin, etc.) to about room temperature (e.g., about 290 Kelvin, etc.). In some instances, a thermally conductive signal line assembly or component thereof (e.g., metal signal line, metal ground layer, etc.) may transfer unwanted heat from a warmer section to a colder section of a cryogenic system, thereby interfering with one or more cryogenic processes. In some instances, an amount of heat transferred by a signal line assembly may depend on a cross-sectional area of the signal line assembly or a thermal conductivity of a material of the signal line assembly. Advantageously, example embodiments according to some aspects of the present disclosure can break a thermal link between temperature stages of a signal line assembly by providing thin-film structures with smaller cross-sectional areas compared to some alternative implementations, thereby reducing thermal leakage and thermal loading in cryogenic systems with multiple temperature stages.

In some instances, example embodiments according to some aspects of the present disclosure can provide for improved structural integrity, manufacturing yield, or other benefits compared to some alternative implementations. For example, some alternative implementations may include attempting to form an entire signal line assembly using only thin-film structures (e.g., without attaching the thin-film structures to a flex circuit board or edge frame, etc.).

However, such thin-film structures may in some instances be more fragile than a corresponding flex circuit board. For this reason, thin-film structures can in some instances be difficult to manufacture at scale, difficult to install (e.g., in a quantum computing system) or maintain, or otherwise difficult to use for some applications (e.g., cryogenic quantum computing applications). Advantageously, systems and methods according to some aspects of the present disclosure can in some instances provide improved thermal properties and other properties compared to some alternative implementations, while still providing sufficient structural integrity, manufacturing yield, or other properties to be suitable for some applications (e.g., cryogenic quantum computing applications) for which a thin-film-only approach may be undesirable.

In some instances, example embodiments according to some aspects of the present disclosure can provide more compact or higher-density signal conditioning structures (e.g., filters, attenuators, thermalization structures, etc.) compared to some alternative implementations. For example, some alternative implementations may include filters that are separate from a flex circuit board assembly. In some instances, filters that are separate from a flex circuit board assembly may be significantly larger (e.g., wider, etc.) than a signal line attached to the filter, thereby limiting a signal line density of a signal line-filter assembly. In some instances, integrating filters into a flex circuit board assembly or otherwise reducing a size of the filters can be challenging, and a size of any filters that are integrated into a flex circuit board or thin-film structure may depend on a scale of a fabrication process used to fabricate the flex circuit board or thin-film structure. Advantageously, example embodiments according to some aspects of the present disclosure can integrate compact signal conditioning structures into a signal line assembly via thin-film structures that can be manufactured according to small-scale microfabrication processes, thereby providing more compact signal conditioning structures compared to some alternative implementations. Additionally, more compact signal conditioning structures can in some instances enable higher signal line density, such as by enabling a larger number of filters to fit into a given space (e.g., a given signal line assembly width, etc.).

In some instances, improved compactness or density according to some aspects of the present disclosure can provide additional technical effects and benefits, such as improved scalability of a quantum computing system; improved thermalization of a cryogenic quantum computing system; and other benefits. For example, as qubit counts associated with a quantum computing system increase, a larger and larger number of hardware components (e.g., qubit hardware, connection hardware, control hardware, etc.) may need to be included in a quantum computing system. In some instances, improved compactness of each individual hardware component can facilitate improved packing density of hardware components of a quantum computing system, thereby facilitating increased qubit counts and improved scaling for a quantum computing system of a given size (e.g., a system that fits into a cryogenic vacuum chamber of a given size, etc.).

As another example, in some instances, a quantum computing system can include a cryogenic quantum computing system having components that must be kept at very low temperatures (e.g., less than 10 Kelvin, less than 3 Kelvin, less than 1 Kelvin, etc.) to operate properly. In some instances, increased compactness or density of one or more hardware components (e.g., example signal conditioning structures according to some aspects of the present disclosure) can decrease a cost of thermalization, increase an effectiveness of thermalization, or the like. For example, in some instances, the use of more compact hardware components can reduce a total volume of a cryogenic vacuum chamber or total volume of hardware components to be thermalized, thereby reducing a cost of thermalization in some instances.

As used herein, the terms "about," "approximately," and similar terms, when used in combination with a numerical value, refer to within 10 percent of the numerical value.

With reference now to the Figures, example embodiments of the present disclosure will be discussed in further detail.

FIG. 1 depicts a cross-sectional view of a portion of an example signal line assembly comprising a flex circuit board 100. The flex circuit board 100 can include one or more signal lines 106. The flex circuit board 100 can be configured to transmit signals by the one or more signal lines 106, such as through a vacuum chamber to couple one or more classical processors to quantum hardware. The flex circuit board 100 can include a plurality of signal lines 106 and can provide a significantly improved signal line density, in addition to providing improved isolation, reduced thermal conductivity, and/or improved scalability. For instance, including flex circuit board(s) 100 according to example aspects of the present disclosure to couple classical processors to quantum hardware can provide for infrastructure that reliably scales to the increasingly greater numbers of qubits that are achieved and/or expected in contemporary and/or future quantum computing systems. In some instances, a thickness of the flex circuit board 100 along the thickness axis 107 can be between 100 and 900 micrometers, such as about 250 micrometers. In some instances, a length of the flex circuit board 100 along a length axis 109 can be between 100 and 900 millimeters, such as about 250 millimeters.

As used herein, a "flex circuit board" refers to a board including at least one generally planar substrate (e.g., layered substrates) or other support on which the one or more signal lines 106 are formed or otherwise disposed and having flexibility in at least one plane. As used herein, "flexibility" refers to a capability of deforming (e.g., subject to mechanical stress, etc.) without breaking. For example, a rectangular flex circuit board 100 may be flexible along a largest surface of the rectangular flex circuit board 100. A rectangular flex circuit board 100 may be flexible and/or rigid along at least a portion of its edges. The flexibility may be achieved as a property of material(s) from which the flex circuit board 100 and/or layers of the flex circuit board 100 is/are formed (e.g., metals, such as copper, copper alloys, niobium, aluminum, etc., dielectric materials, nonmetals, polymers, rubbers, etc.), achieved by hinging and/or segmenting of the flex circuit board 100 (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, the flex circuit board 100 can include at least one ground layer 102. The ground layer 102 can form an outer surface of the flex circuit board 100, such as an outer surface along the largest surface. In some embodiments, the flex circuit board 100 can include two ground layers 102, such as two parallel and spaced apart ground layers 102. For instance, the two ground layers 102 can form both largest outer surfaces of the flex circuit board 100. A ground layer 102 can act as an electrical isolation layer to isolate signal lines 106 on one side of the ground layer 102 from interfering signals (e.g., from signal lines 106 on other layers, other boards, the environment, etc.) on another side of the ground layer 102. For instance, the ground layer 102 can be coupled to earth ground and/or other suitable ground(s).

The ground layer(s) 102 can be or can include any suitable electrically conductive material. In some embodiments, the ground layer(s) 102 can be or can include superconducting ground layer(s) 102 including superconducting material(s), such as superconducting material(s) that achieve(s) superconductivity at a temperature less than about 3 kelvin, such as about 1 kelvin, such as about 20 millikelvin. As examples, the ground layer(s) 102 can be or can include niobium, tin, aluminum, molybdenum disulfide, BSCCO, and/or other suitable superconducting materials. Additionally and/or alternatively, the ground layer(s) 102 can be or can include material having high signal transfer performance characteristics, such as low resistance, low reflectivity, low distortion, etc. such that a signal is substantially unchanged by passing through the signal line. As examples, the ground layer(s) 102 can be or can include copper, gold, and/or other suitable materials having high signal transfer performance characteristics. Additionally and/or alternatively, the ground layer (s) 102 can be or can include material(s) having desirable thermal characteristics, such as suitably high and/or low thermal transfer, such as, for example, copper, copper alloy, etc.

In some embodiments, the flex circuit board 100 can include at least one dielectric layer 104. The dielectric layer(s) 104 can be or can include any suitable dielectric material, such as dielectric polymers. In some embodiments, the dielectric layer(s) 104 can be or can include flexible dielectric material. As one example, the dielectric layer(s) 104 can be or can include polyimide. At least a portion of the dielectric layer(s) 104 can be formed on or otherwise disposed proximate to at least a portion of an inner surface of the ground layer(s) 102. For example, in some embodiments, an inner surface of a ground layer 102 can be mated with an outer surface of a dielectric layer 104. Furthermore, in some embodiments, inner surfaces of two dielectric layers 104 can be mated with signal lines 106 disposed therebetween.

The flex circuit board 100 can include one or more signal lines 106. The one or more signal lines 106 can be disposed on a surface (e.g., an inner surface) of at least one dielectric layer 104. As an example, in some implementations, the one or more signal lines 106 can be disposed between opposing inner surfaces of two dielectric layers 104. The signal line(s) 106 can be or can include any suitable electrically conductive material. In some embodiments, the signal line(s) 106 can be or can include superconducting signal line(s) 106 including superconducting material(s), such as superconducting material(s) that achieve(s) superconductivity at a temperature less than about 3 kelvin, such as about 1 kelvin, such as about 20 millikelvin. As examples, the signal line(s) 106 can be or can include niobium, tin, aluminum, molybdenum disulfide, BSCCO, and/or other suitable superconducting materials. Additionally and/or alternatively, the signal line(s) 106 can be or can include material having high signal transfer performance characteristics. As examples, the signal line(s) 106 can be or can include copper, gold, and/or other suitable materials having suitably high and/or low signal transfer performance characteristics. Additionally and/or alternatively, the signal line(s) 106 can be or can include material(s) having desirable thermal characteristics, such as, for example, copper, copper alloy, etc.

The thickness axis 107 can be, for example, an axis for describing or measuring a thickness of the flex circuit board 100. For example, as used herein, the term "thickness," when used to describe a flex circuit board 100 or thin-film structure having a stripline configuration (e.g., having two ground layers 102, two dielectric layers 104, and a plurality of signal lines 106) can include a distance between an outer (e.g., top) surface of a first ground layer 102 and an outer (e.g., bottom) surface of a second ground layer 102. In some instances, a thickness axis 107 can be an axis describing a smallest of three dimensions of a flex circuit board 100, and "thickness" can refer to a size of the flex circuit board 100 across the smallest of the three dimensions. In such instances, the term "length" can refer to a size of the flex circuit board 100 across a largest dimension of the three dimensions, and the term "width" can refer to a size of the flex circuit board 100 across a third dimension that is neither the smallest nor the largest of the three dimensions. In some instances, a thickness of the flex circuit board 100 along the thickness axis 107 can be between 100 and 900 micrometers, such as between about 150 and about 600 micrometers, such as between about 200 and about 300 micrometers, such as about 250 micrometers.

Similarly, the length axis 109 can be, for example, an axis for describing or measuring a length of the flex circuit board 100. For example, the term "length" can refer to a length of the flex circuit board 100 across a longest dimension of three dimensions of the flex circuit board 100. In some instances, a length of the flex circuit board 100 along a length axis 109 can be between 100 and 900 millimeters, such as between about 150 and about 600 millimeters, such as between about 200 and about 300 mm, such as about 250 millimeters.

Figure 2:
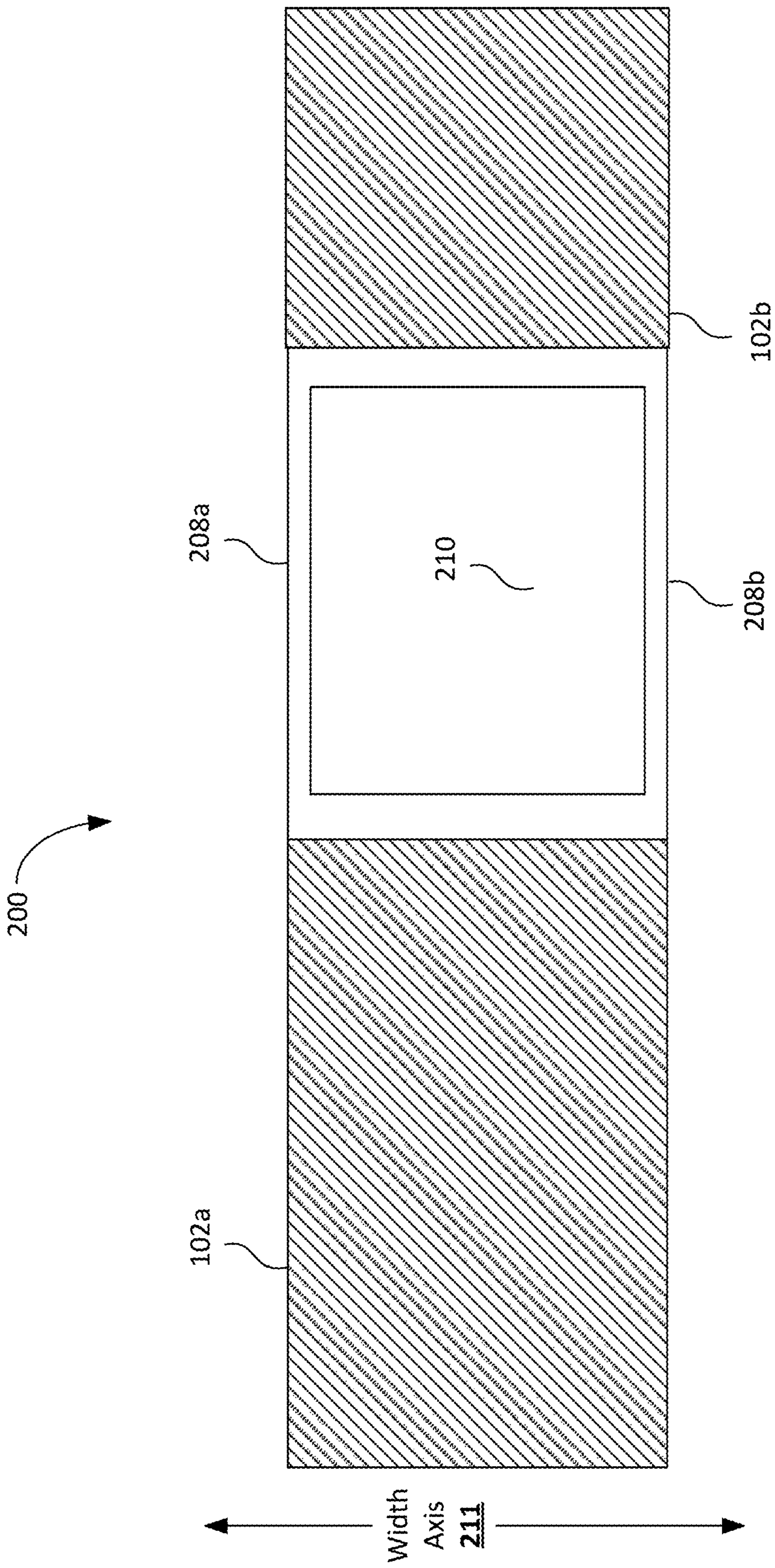
FIG. 2 depicts a top view of a portion of an example flex circuit board according to some aspects of the present disclosure.

FIG. 2 depicts a top view of a portion of an example flex circuit board 200 according to some aspects of the present disclosure. A flex circuit board can have a cutout section 210 surrounded by an edge frame 208. The cutout section 210 can be, for example, empty space (e.g., vacuum, air, etc.). In some instances, the flex circuit board 200 can include a plurality of layers (e.g., as depicted in FIG. 1, etc.), such as two ground layers 102, two dielectric layers 104, and a plurality of signal lines 106. In some instances, the edge frame 208 can include one or more dielectric layers 104 or other material having low thermal conductivity, and can lack any metal structures (e.g., ground layers 102, signal lines 106, etc.) or other material having high thermal conductivity.

An edge frame 208 can include, for example, two edge structures 208*a*, 208*b* on either side of the cutout section 210 to physically couple a first flex circuit board portion to the left of the cutout section 210 as depicted in FIG. 2 with a second flex circuit board portion to the right of the cutout section 210 as depicted in FIG. 2. In some instances, an edge frame 208 can comprise one or more dielectric materials, which can be the same as or different from a dielectric layer of one or more dielectric layers 104 of the flex circuit board 200. In some instances, an edge frame 208 can comprise a dielectric material having low thermal conductivity (e.g., polyimide, etc.) to minimize heat transfer across the edge frame 208 (e.g., from a left side to a right side of the cutout section 210 as depicted in FIG. 2, etc.). In some instances, a thickness of the edge frame can be about equal to or smaller than a thickness of a remainder of the flex circuit board 200, such as about equal to or smaller than a combined thickness of two dielectric layers 104 of the flex circuit board 200. In some instances, a width of each of the two edge structures 208*a*, 208*b* of the edge frame along a width axis 211 can be less than about 20 millimeters (mm), such as less than about 10 mm, such as between about 2 mm and about 8 mm, such as between about 4 mm and about 6 mm, such as about 5 mm. In some instances, a width of each of the two edge structures 208*a*, 208*b* of the edge frame can be less than about 5 mm, such as between about 1 mm and about 4 mm, such as between about 2 mm and about 3 mm, such as about 2.5 mm. For example, in some instances, a flex circuit board 200 can have a width along the width axis 211 of about 35 mm, and a cutout 210 can have a width between about 25 mm and about 30 mm inclusive. Other widths are possible. In some instances, the cutout 210 can be approximately centered in the flex circuit board 200 along the width axis 211, such that each edge structure 208*a*, 208*b* has approximately the same width.

In some instances, an edge frame 208 can consist solely of one or more dielectric materials or other materials having low thermal conductivity. For example, in some instances, a ground layer 102 of a flex circuit board 200 can include a first ground layer 102*a* that terminates before it reaches the edge frame 208 or cutout 210, and a second ground layer 102*b* that terminates before it reaches the edge frame 208 or cutout 210. Similarly, in some instances, one or more signal lines 106 of a flex circuit board 200 may terminate at or before a cutout section 210, and an edge frame may consist solely of one or more dielectric materials (e.g., materials of a dielectric layer 104, etc.). In some instances, the edge frame 208 can lack any metal components. In some instances, a first ground layer 102*a* and second ground layer 102*b* may be electrically coupled by one or more thin-film structures bridging the cutout section 210, such as one or more thin-film structures described below with respect to FIGS. 3-6.

In some instances, a flex circuit board 200 can have a length between 100 and 900 mm along a length axis 109, such as between about 150 mm and 600 mm, such as between about 200 mm and 300 mm, such as about 250 mm. In some instances, a thickness of the flex circuit board 200 along a thickness axis 107 can be between 100 and 900 micrometers (μm), such as between about 150 μm and 600 μm, such as between about 200 μm and 300 μm, such as about 250 μm.

A cutout 210 can include, for example, an empty space in the flex circuit board 200. In some instances, the cutout 210 can be surrounded by an edge frame 208 on one or more (e.g., four) sides, and can be open at a top side and a bottom side, wherein FIG. 2 is defined as a top-down view of the flex circuit board 200. In some instances, the cutout 210 can have a length or width between 10 and 90 mm, such as between about 15 and about 60 mm, such as between about 20 and about 40 mm, such as between about 25 and 30 mm. In some instances, the cutout 210 can have a width that is slightly less than a width of the flex circuit board 200, such as less than the width of the flex circuit board by between about 1 and about 20 mm, such as between about 3 and about 15 mm, such as between about 5 and about 10 mm. Other lengths and widths are possible.

In some instances, fabricating a flex circuit board 200 can include fabricating (e.g., via lithography, etching, drilling, plating, lamination, etc.) a first flex circuit board (e.g., flex circuit board 100, etc.) without a cutout, and cutting the cutout 210 (e.g., using a laser cutting process, mechanical cutting, etc.). However, other methods can be used without deviating from the scope of the present disclosure. For example, fabricating a flex circuit board 200 can include laminating a flex circuit board 200 using one or more layers comprising a cutout section 210 in each layer, or otherwise fabricating a flex circuit board 200 that may include a cutout section 210 without needing to be cut.

In some instances, a flex circuit board 200 can be, comprise, be comprised by, or otherwise share one or more properties with a flex circuit board 100. For example, in some instances, a flex circuit board 200 can have any property described herein with respect to a flex circuit board 100 and vice versa.

Figure 3:
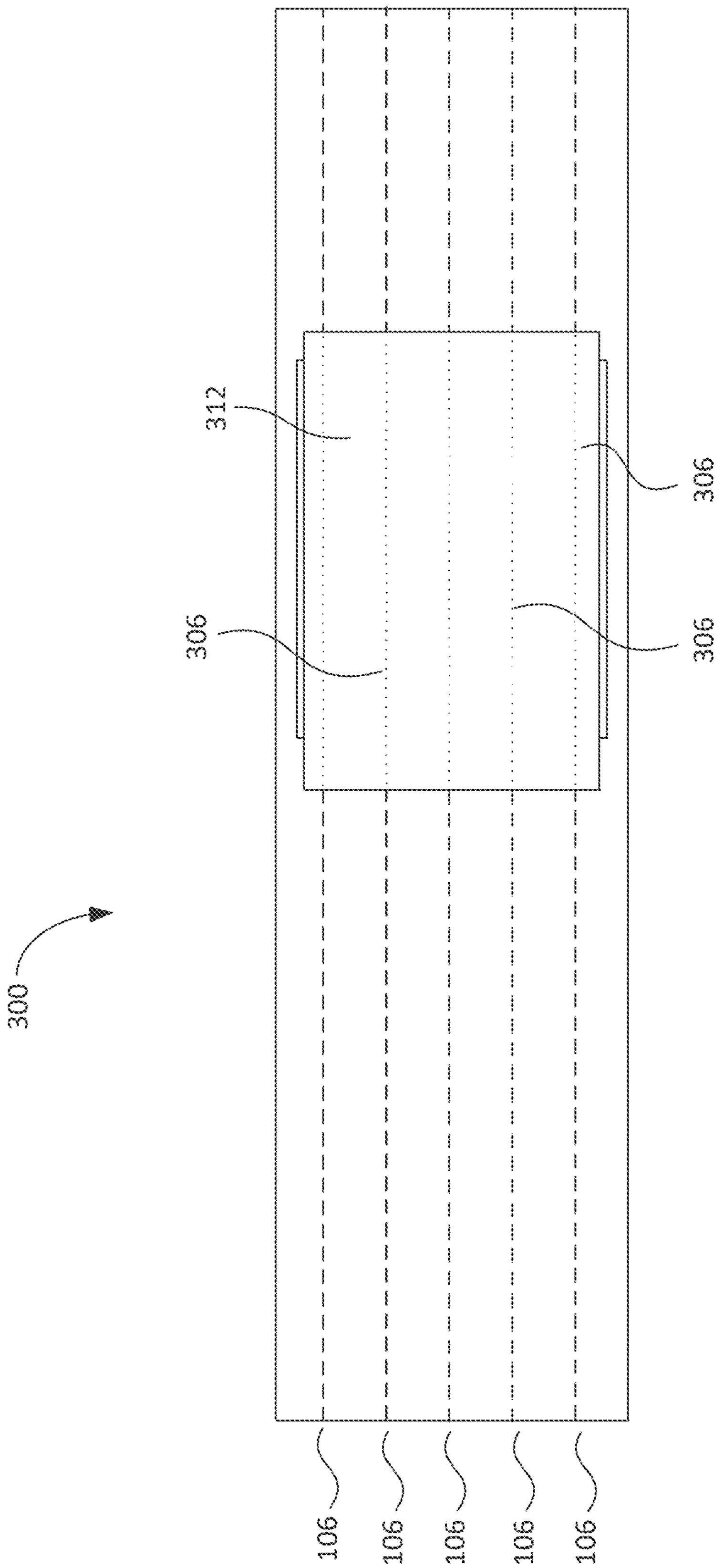
FIG. 3 depicts a top view of a portion of an example signal line assembly comprising a film structure according to some aspects of the present disclosure.

FIG. 3 depicts a top view of a portion of an example signal line assembly 300 comprising a thin-film structure 312 according to some aspects of the present disclosure. The signal line assembly 300 can include a flex circuit board (e.g., flex circuit board 200, etc.) having a cutout section 210 and a plurality of signal lines 106. The signal line assembly 300 can further include a thin-film structure 312 having a plurality of signal lines 306, with each signal line 306 electrically coupled at each end to a corresponding signal line 106 of the flex circuit board. In some instances, the flex circuit board and thin-film structure 312 can each have a plurality of layers, such as two ground layers 102, two dielectric layers 104, and a plurality of signal lines 106, 306 disposed between the dielectric layers.

A signal line 306 can be, comprise, be comprised by, or otherwise share one or more properties with a signal line 106. For example, a signal line 306 can have any property described herein with respect to a signal line 106. In some instances, a signal line 306 can be smaller than a corresponding signal line 106 along one or more dimensions (e.g., along a thickness axis 107, etc.). For example, in some instances, a thickness of each signal line 306 along the thickness axis 107 can be between about 100 and about 900 nanometers (nm), such as between about 150 and about 600 nm, such as between about 200 and about 300 nm, such as about 250 nm. In some instances, a signal line 106 can be thicker along the thickness axis 107 compared to a signal line 306, such as between about 10 and about 25 micrometers, such as between about 15 and about 20 micrometers, such as about 17.5 micrometers.

A signal line 306 can include one or more conductive materials, such as non-superconducting conductive materials (e.g., normal metal such as copper, etc.) or superconducting materials (e.g., niobium, etc.). For example, some cryogenic quantum computing systems may include a first signal line assembly comprising a thin-film structure 312 with one or more non-superconducting signal lines, and a second signal line assembly comprising a thin-film structure 312 with one or more superconducting signal lines. For example, in some instances, a non-superconducting material can be used in one or more warmer stages of a cryogenic system, and a superconducting material can be used in one or more colder stages of the cryogenic system. In some instances, a superconducting material can include a superconducting material that becomes superconducting at a critical temperature, such as a temperature below about 10 Kelvin, such as below about 3 Kelvin, such as below about 1 Kelvin. In some instances, a first signal line 306 disposed in a temperature stage warmer than the critical temperature can comprise a non-superconducting material, and a second signal line 306 disposed in a temperature stage colder than the critical temperature can comprise the superconducting material. In some instances, a signal line 306 can include or be associated with one or more barrier layers (e.g., aluminum barrier layers, etc.), such as barrier layers separating the signal line 306 from one or more dielectric layers 104 of the thin-film structure 312.

In some instances, a thin-film structure 312 can have any property described herein with respect to a flex circuit board 100, 200, except that a thin-film structure 312 can be smaller than a flex circuit board 100 along one or more dimensions (e.g., along a thickness axis 107, length axis 109, width axis 211, etc.). For example, in some instances, a thickness of a thin-film structure 312 along a thickness axis 107 can be between 10 and 90 micrometers, such as between about 15 and about 60 μm, such as between about 20 and about 30 μm, such as about 25 μm. In some instances, a ratio of a thickness of a flex circuit board 100, 200 to a thin-film structure 312 coupled to the flex circuit board 100, 200 can be between about 2 and about 30, such as between about 4 and about 20, such as between about 6 and about 15, such as between about 8 and about 12, such as about 10. In some instances, a thin-film structure 312 can have a length along the length axis 109 that is about equal to or slightly longer than a length of a corresponding cutout section 210 bridged by the length axis 109, such as about 5 mm longer. In some instances, the thin-film structure 312 can have a width about the width axis 211 that is about equal to or slightly smaller than a width of the cutout 210, such as about 5 mm smaller. In some instances, the thin-film structure can be fabricated according to one or more microfabrication techniques, such as spin-on of polyimide (e.g., polyimide with or without additives), polyimide curing, photolithography, metal deposition, etching, plating, release from a host substrate, etc.

In some instances, a location of a thin-film structure 312 or cutout section 210 along a signal line assembly 300 or quantum computing system can be based at least in part on one or more thermalization needs or signal conditioning needs associated with the quantum computing system. For example, in some instances, a cryogenic quantum computing system can include a plurality of temperature stages characterized by different operating temperatures. In some instances, some transitions between temperature stages may present significant thermalization challenges, whereas other transitions may present fewer thermalization challenges. In some instances, one or more thin-film structures 312 can be placed near a temperature transition associated with significant thermalization challenges to break a thermal link across the thin-film structure, thereby reducing thermal leakage associated with a challenging temperature transition.

Figure 4:
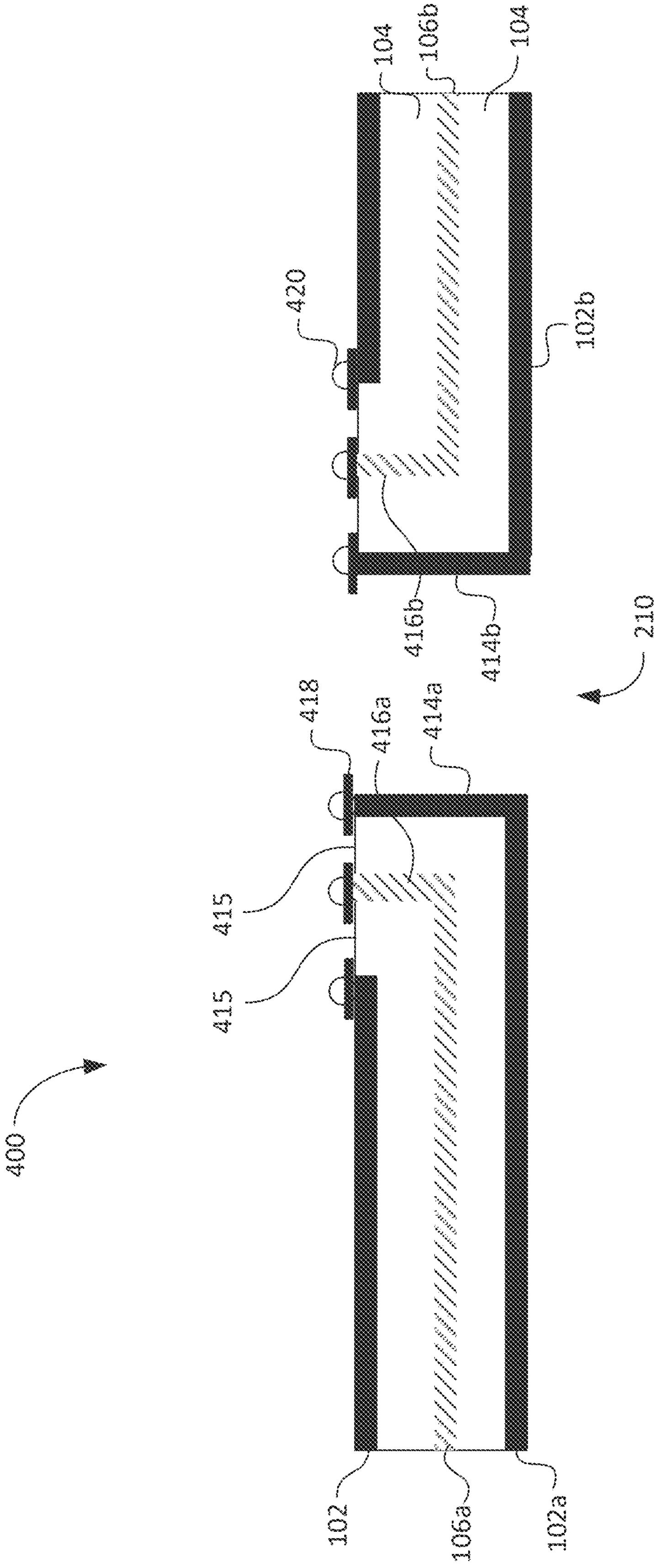
FIG. 4 depicts a cross-sectional side view of a portion of an example flex circuit board according to some aspects of the present disclosure.

FIG. 4 depicts a cross-sectional side view of a portion of an example flex circuit board 400 according to some aspects of the present disclosure. The flex circuit board 400 can include a cutout section 210 surrounded by an edge frame 208 (not depicted in FIG. 4). The flex circuit board can include one or more ground layer(s) 102, dielectric layer(s) 104, and signal line(s) 106. In some instances, one or more vias 414, 416 can connect one or more signal lines 106 or ground layers 102 to a surface (e.g., top surface, etc.) of the flex circuit board 400. For example, in some instances, a first bottom-facing ground layer 102*a* or first signal line 106*a* to the left (as oriented in FIG. 4) of the cutout section 210 can be connected to a first top surface of the flex circuit board 400 by vias 414*a* and 416*a* respectively. In some instances, a second bottom-facing ground layer 102*b* or second signal line 106*b* to the right (as oriented in FIG. 4) of the cutout section 210 can be connected to a second top surface of the flex circuit board 400 by vias 414*b* and 416*b* respectively. In some instances, one or more vias 414, 416, ground layers 102, or signal lines 106 can be coupled to one or more signal pads 418. In some instances, one or more bump bonds 420 can be applied to one or more signal pads 418, vias 416, ground layers 102, or signal lines 106.

A via 414 can extend from a ground layer 102 on a first side (e.g., bottom side as depicted in FIG. 4, etc.) of the flex circuit board 400 to an exterior surface opposite the first side (e.g., top surface). The via 414 can include one or more materials (e.g., non-superconducting materials such as copper, superconducting materials such as niobium, etc.) that are the same as or different from a material of a ground layer 102 coupled to the via 414. In some instances, a flex circuit board comprising a via 414 can be manufactured by laminating one or more layers 102, 104, 106; drilling a hole through some or all of the layers 102, 104, 106; and electroplating the hole with a conductive material (e.g., copper, niobium, etc.) that is the same as or different from a ground layer 102 coupled to the via 414. Other methods are possible.

In some instances, a ground layer 102 can include one or more gaps 415 between vias 414, 416 to electrically isolate the ground layers 102 from the signal lines 106 and from other ground layers 102. A gap can include, for example, a region of the flex circuit board 400 wherein one or more dielectric layers 104 may be exposed to an exterior surface of the flex circuit board 400.

A via 416 can extend from a signal line 106 of the flex circuit board 400 (e.g., in an interior of a flex circuit board 400 as depicted in FIG. 4, etc.) to an exterior surface of the flex circuit board 400 (e.g., top surface as depicted in FIG. 4, etc.). The via 416 can include one or more materials (e.g., non-superconducting materials such as copper, superconducting materials such as niobium, etc.) that are the same as or different from a material of a signal line 106 coupled to the via 416. In some instances, a flex circuit board comprising a via 416 can be manufactured by laminating one or more layers 102, 104, 106; drilling a hole through some or all of the layers 102, 104, 106; and electroplating the hole with a conductive material (e.g., copper, niobium, etc.) that is the same as or different from a material of a signal line 106 coupled to the via 416. In some instances, some vias 416 can be so-called "blind vias" that extends from the signal line 106 to only one side of the flex circuit board 400. Additionally or alternatively, some vias 416 can be so-called "through vias" that extend from a first surface (e.g., bottom, etc.) to a second surface (e.g., top, etc.) of the flex circuit board 400.

A signal pad 418 can include, for example, an electrically conductive structure (e.g., metal disk, conductive pad, thin-film pad, electroplated structure, electrical contact, interposer structure, etc.) configured to electrically couple a first structure (e.g., via 414, 416; ground layer 102; etc.) to a second structure (e.g., bump bond 420, etc.). A signal pad 418 can include, for example, a material (e.g., superconducting material, non-superconducting material, etc.) that is the same as or different from a corresponding via 414, 416, signal line 106, or ground layer 102 electrically coupled to the signal pad 418. In some instances, a signal pad 418 can include a metal structure fabricated via an underbump metallization process. In some instances, example materials that may be suitable for underbump metallization can include one or more of titanium, gold, or copper.

A bump bond 420 can include, for example, a small amount of conductive material attached to the signal pad 418 to facilitate bonding (e.g., adhesion, electrical coupling, etc.) the signal pad 418 to another structure. A bump bond 420 can include, for example, a small amount of low-melting-point metal, such as a metal having a lower melting point than a material of a corresponding signal pad 418 or other structure (e.g., via 414, 416; ground layer 102; signal line 106; etc.). An example bump bond 420 suitable for some superconducting applications can include indium. Other materials (e.g., solder materials, etc.) can be used without deviating from the scope of the present disclosure. In some instances, underfill (e.g., epoxy underfill, etc.) can be used to stabilize one or more bump bonds 420.

Although FIG. 4 depicts using signal pads 418 and bump bonds 420 to facilitate coupling (e.g., electrically coupling, adhering, etc.) a flex circuit board 400 with another structure (e.g., thin-film structure), other coupling mechanisms (e.g., interposer connections, connections without signal pads 418, connections without bump bonds 420, etc.) can be used without deviating from the scope of the present disclosure. In some instances, a coupling mechanism or electrical transition between a flex circuit board 400 and another structure (e.g., thin-film structure 312, etc.) can include a structure optimized for microwave frequencies (e.g., 3-8 GHz, etc.).

In some instances, a flex circuit board 400 can be, comprise, be comprised by, or otherwise share one or more properties with a flex circuit board 100, 200. For example, in some instances, a flex circuit board 400 can have any property described herein with respect to a flex circuit board 100, 200 and vice versa.

Figure 5:
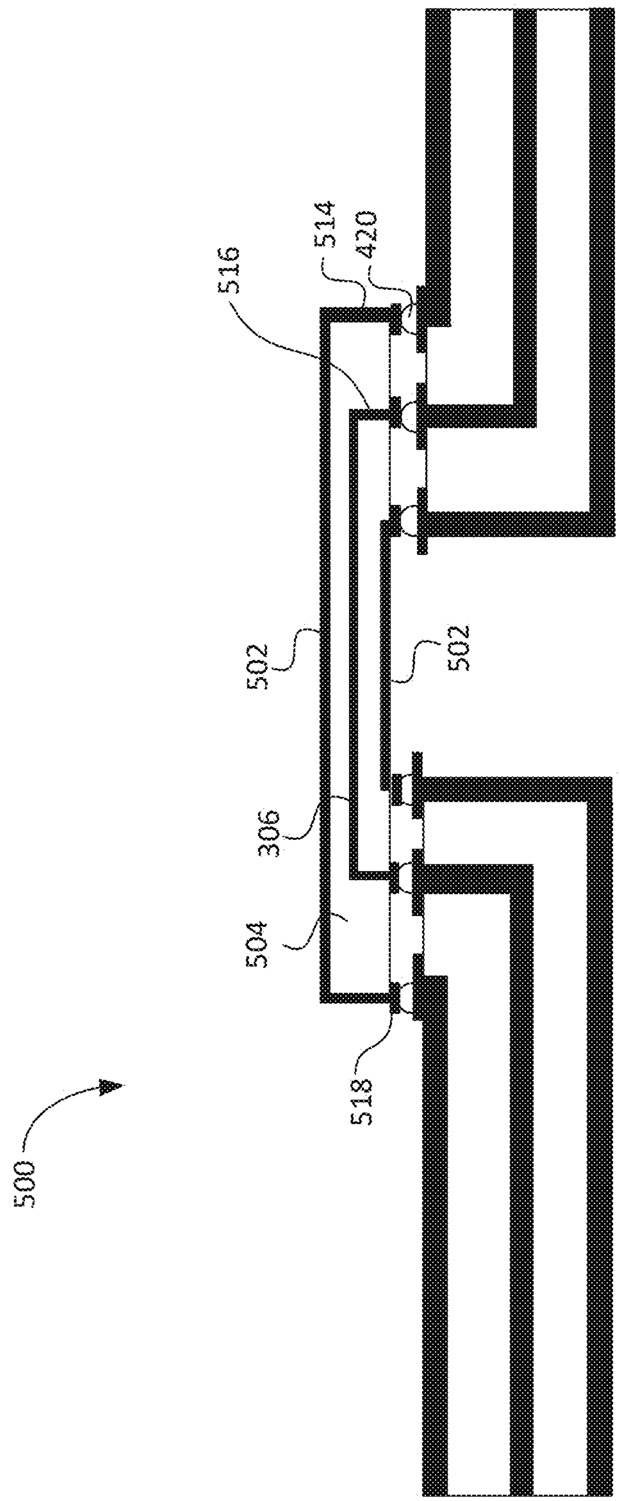
FIG. 5 depicts a cross-sectional side view of a portion of an example signal line assembly comprising a film structure according to some aspects of the present disclosure.

FIG. 5 depicts a cross-sectional side view of a portion of an example signal line assembly 500 comprising a thin-film structure according to some aspects of the present disclosure. The signal line assembly 500 can include a flex circuit board (e.g., flex circuit board 400, etc.); one or more bump bonds 420 coupled to the flex circuit board (e.g., as depicted in FIG. 4, etc.); and a thin-film structure coupled to the flex circuit board via the bump bonds 420. The thin-film structure can include, for example, one or more ground layer(s) 502, signal line(s) 306, dielectric layer(s) 504, vias 514, 516, signal pads 518, or other components.

In some instances, a ground layer 502 can share one or more properties with a ground layer 102. For example, in some instances, a ground layer 502 can have any property described herein with respect to a ground layer 102. In some instances, a ground layer 502 of a thin-film structure can have a dimension (e.g., thickness, etc.) that is smaller than a corresponding dimension of a ground layer 102 of a flex circuit board 100. For example, in some instances, a ratio of a thickness of a ground layer 102 of a signal line assembly 500 to a ground layer 502 of a signal line assembly 500 can be greater than about two, such as greater than about four, such as greater than about six, such as greater than about eight, such as greater than about ten.

In some instances, a dielectric layer 504 can share one or more properties with a dielectric layer 104. For example, in some instances, a dielectric layer 504 can have any property described herein with respect to a dielectric layer 104. In some instances, a dielectric layer 504 of a thin-film structure 312 can have a dimension (e.g., thickness, etc.) that is smaller than a corresponding dimension of a dielectric layer 104 of a flex circuit board 100. In some instances, a dielectric layer 504 can have a thickness on the thickness axis 107 that is less than about 25 micrometers, such as less than about 15 micrometers, such as less than about 12 micrometers, such as less than about 10 micrometers, such as less than about 8 micrometers, such as less than about 6 micrometers. In some instances, a dielectric layer 104 can be thicker than a dielectric layer 504, such as between about 50 and about 450 micrometers on the thickness axis 107, such as between about 70 and about 300 micrometers, such as between about 90 and about 120 micrometers, such as about 100 micrometers. In some instances, a dielectric material (e.g., polyimide thin film, etc.) of a dielectric layer 504 can be the same as or different from a material of a dielectric layer 104. In some instances, fabricating a dielectric layer 504 or signal line assembly 500 can include one or more microfabrication techniques, such as spin-on of polyimide, polyimide curing, photolithography, metal deposition, etching, plating, release from host substrate, or other microfabrication method.

In some instances, a via 514 can share one or more properties with a via 414. For example, in some instances, a via 514 can have any property described herein with respect to a via 414. In some instances, a via 514 of a thin-film structure 312 can have a dimension (e.g., diameter, etc.) that is smaller than a corresponding dimension of a via 414 of a flex circuit board 400. For example, a size of a via 414, 514 along a thickness axis 107 of a flex circuit board 400 or thin-film structure 312 can be approximately proportional to a thickness of one or more corresponding dielectric layers 104, 504. In some instances, a size (e.g., diameter, etc.) of a via 414, 514 along a length axis 109 or width axis 211 of the flex circuit board 400 or thin-film structure 312 can be approximately proportional to (e.g., about equal to, between about 0.5 and about 2 times, etc.) a thickness of a corresponding ground layer 102, 502 coupled to the via 414, 514.

In some instances, a via 516 can share one or more properties with a via 416. For example, in some instances, a via 516 can have any property described herein with respect to a via 416. In some instances, a via 516 of a thin-film structure 312 can have a dimension (e.g., diameter, etc.) that is smaller than a corresponding dimension of a via 416 of a flex circuit board 400. For example, a size of a via 416, 516 along a thickness axis 107 can be approximately proportional to a thickness of one or more corresponding dielectric layers 104, 504. In some instances, a size (e.g., diameter, etc.) of a via 416, 516 along a length axis 109 or width axis 211 can be approximately proportional to (e.g., about equal to, between about 0.5 and about 2 times, etc.) a thickness of a corresponding signal line 106, 306 coupled to the via 416, 516.

In some instances, a signal pad 518 can share one or more properties with a signal pad 418. For example, in some instances, a signal pad 518 can have any property described herein with respect to a signal pad 418. In some instances, a signal pad 518 of a thin-film structure 312 can have a dimension (e.g., thickness, etc.) that is smaller than a corresponding dimension of a signal pad 418 of a flex circuit board 400. In some instances, a size (e.g., diameter, etc.) of a signal pad 418, 518 along a thickness axis 107 can be similar to (e.g., about equal to, between about 0.5 and about 2 times, etc.) a thickness of a corresponding signal line 106, 306 or ground layer 102, 302 electrically coupled to the signal pad 418, 518.

In some instances, all or part of the signal line assembly 500 or one or more components thereof (e.g., vias 514, 516, etc.) can be manufactured according to one or more microfabrication methods described herein (e.g., with respect to FIG. 3).

Figure 6:
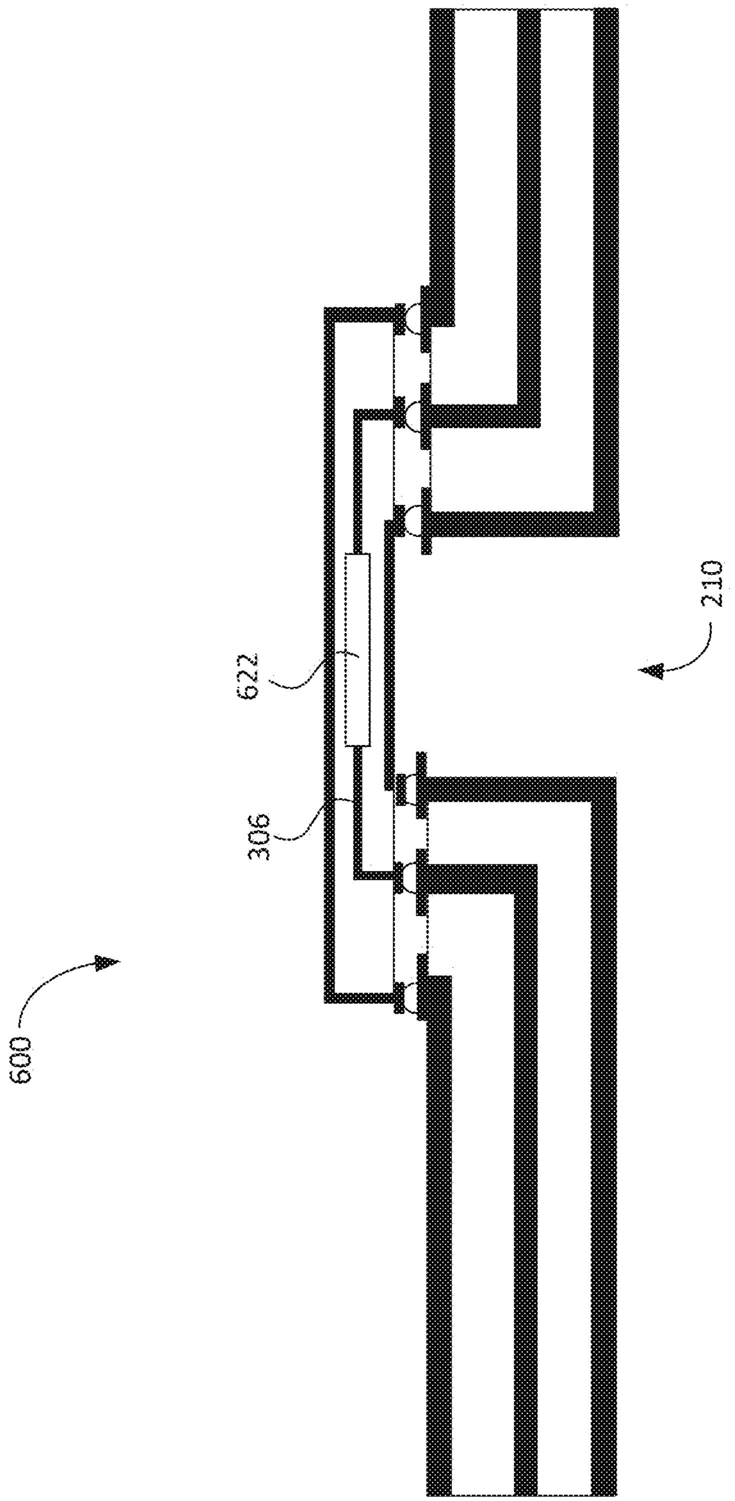
FIG. 6 depicts a cross-sectional side view of a portion of an example signal line assembly comprising one or more signal conditioning structures according to some aspects of the present disclosure.

FIG. 6 depicts a cross-sectional side view of a portion of an example signal line assembly 600 comprising one or more signal conditioning structures according to some aspects of the present disclosure. The signal line assembly 600 can include, for example, a flex circuit board having a cutout section 210; one or more bump bonds; and a thin-film structure coupled to the flex circuit board via the bump bonds. The thin-film structure can include one or more signal lines 306 and one or more signal conditioning structures 622 coupled to the one or more signal lines 306.

A signal conditioning structure 622 can include, for example, a filter, an attenuator, a thermalization structure, or other signal conditioning structure. As used herein, the term "filter" can refer to a structure having frequency-dependent attenuation properties. For example, a filter can in some instances selectively attenuate signals of a first frequency range to a greater degree than signals of a second frequency range. In some instances, a signal conditioning structure 622 can include a filter structure, such as a bandpass filter structure (e.g., inductor-capacitor bandpass structure, etc.). As used herein, the term "attenuator" can refer to a structure having an approximately flat frequency response curve, such that signals of different frequencies are attenuated to similar degrees. A thermalization structure can include any structure configured to influence (e.g., increase, decrease, etc.) heat transfer from one component of a signal line assembly 600, quantum computing system, cryogenic system, or the like, to another structure. In some instances, a signal conditioning structure 622 can include a photolithographically defined signal conditioning structure 622 (e.g., photolithographically defined filter structure, photolithographically defined attenuator structure, photolithographically defined thermalization structure, etc.). In some instances, a signal conditioning structure 622 (e.g., photolithographically defined signal conditioning structure 622) can be fabricated according to one or more microfabrication techniques, such as photolithography, metal deposition, etching, plating, release from host substrate, or other microfabrication techniques; and combinations thereof.

In some instances, a signal conditioning structure 622 or signal line assembly 600 can include one or more absorptive or reflective materials for attenuating high-frequency signals, such as infrared signals. For example, in some instances, a signal conditioning structure 622 or signal line assembly 600 can incorporate, into the signal transmission path, one or more materials that are characterized by frequency-dependent loss. For example, in some instances, a thin-film structure 312 can include one or more materials comprising a mixture of a dielectric material (e.g., polyimide, etc.) and one or more materials (e.g., powders, etc.) having frequency-dependent loss, such as materials that strongly attenuate frequencies in the infrared frequency range. In some instances, the dielectric material can be, comprise, or be comprised by a dispersion medium, and the materials having frequency-dependent loss can be dispersed in the dispersion medium. In some instances, one or more powders having frequency-dependent loss can be mixed with a liquid dielectric material (e.g., liquid polyimide, etc.) during a fabrication process, and the mixture can be used to fabricate a solid material comprising a solid dielectric dispersion medium with one or more frequency-dependent loss materials dispersed therein. Example fabrication processes can include spin-on of polyimide, polyimide curing, or other process for fabricating dielectric from a liquid material. In some instances, frequency-dependent loss materials can include one or more materials that strongly attenuate signals above a threshold (e.g., superconducting gap frequency associated with a superconducting energy gap, etc.), such as above a maximum frequency of a frequency range of a bandpass filter, above an operating frequency range of a quantum computing system (e.g., 3-8 GHz, etc.) or component thereof (e.g., individual qubit, bandpass filter, control hardware, etc.), or other threshold. Example materials having frequency-dependent loss can include normal metals (e.g., copper, silver, gold, platinum, etc.), superconducting materials having a low superconducting energy gap (e.g., iridium, hafnium, titanium, ruthenium, zinc; superconductor-normal metal alloys, such as copper-tin, gold-lead, or tantalum-gold; superconductors with intentionally added magnetic impurities, such as iron, nickel, or chromium; etc.), materials characterized by a superconductor-to-lossy-insulator transition (e.g., niobium silicide, etc.), materials having magnetic loss properties (e.g., ferrites such as Mn—Zn, carbonyl iron, carbonyl nickel, stainless steel, iron, nickel, chromium), or semiconductors having a low bandgap (e.g., InAs, PbS, PbSe, n- or p-doped silicon, copper oxide).

Figure 7:
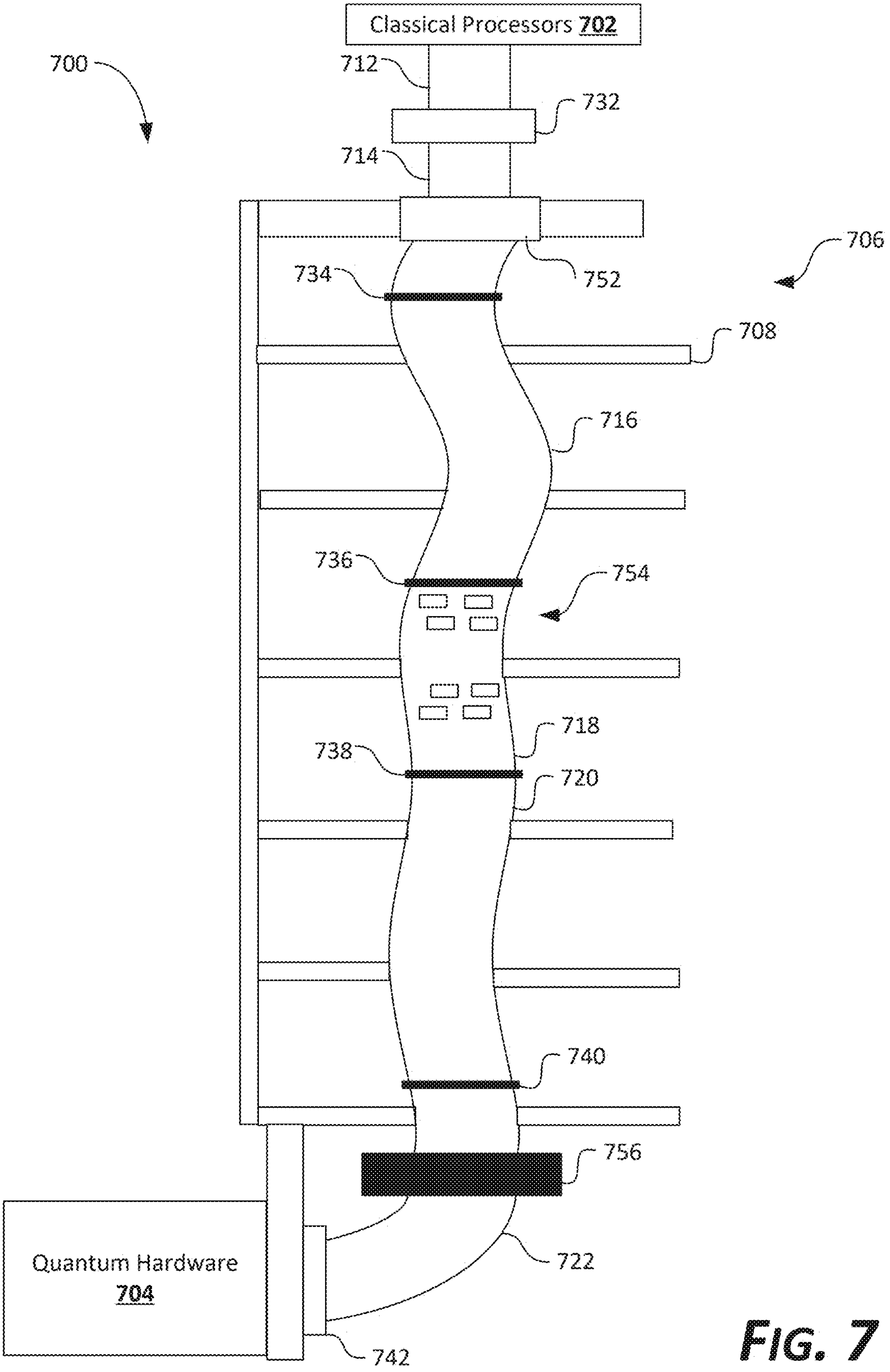
FIG. 7 depicts an example quantum computing system according to example embodiments of the present disclosure.

FIG. 7 depicts an example quantum computing system 700 according to example embodiments of the present disclosure. The quantum computing system 700 can include one or more classical processors 702 and quantum hardware 704 including one or more qubits. The quantum computing system 700 can include a chamber mount 708 configured to support the quantum hardware 704 and a vacuum chamber configured to receive the chamber mount 708 and dispose the quantum hardware 704 in a vacuum. The vacuum chamber can form a cooling gradient from an end of the vacuum chamber (e.g., cap 707) to the quantum hardware 704. For example, the vacuum chamber can form a cooling gradient from a first temperature, such as room temperature (e.g., about 300 kelvin) to a second temperature, such as at or about absolute zero (e.g., about 10 millikelvin), such as to provide a temperature at the quantum hardware 704 at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

The quantum computing system 700 can include one or more signal lines between the classical processor(s) 702 and quantum hardware 704. According to example aspects of the present disclosure, the quantum computing system 700 can include one or more flex circuit boards 706 including one or more signal lines. The flex circuit board(s) 706 can be configured to transmit signals by the one or more signal lines through the vacuum chamber to couple the one or more classical processors 702 to the quantum hardware 704. The flex circuit board(s) 706 can include a plurality of signal lines and can provide a significantly improved signal line density, in addition to providing improved isolation, reduced thermal conductivity, and/or improved scalability. For instance, including flex circuit boards 706 according to example aspects of the present disclosure to couple the classical processors 702 to the quantum hardware 704 can provide for infrastructure that reliably scales to the increasingly greater numbers of qubits that are achieved and/or expected in contemporary and/or future quantum computing systems. Example flex circuit boards that may be employed in accordance with example aspects of the present disclosure are illustrated in FIGS. 1-6.

In some embodiments, some or all of the flex circuit board(s) 706 can include at least one ground layer. The ground layer can form an outer surface of the flex circuit board 706, such as an outer surface along the largest surface. In some embodiments, the flex circuit board 706 can include two ground layers, such as two parallel and spaced apart ground layers. For instance, the two ground layers can form both largest outer surfaces of the flex circuit board 706. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature less than about 3 kelvin, such as about 1 kelvin, such as about 20 millikelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, etc.

In some embodiments, the flex circuit board 706 can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board 706 can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve (s) superconductivity at a temperature less than about 3 kelvin, such as about 1 kelvin, such as about 20 millikelvin. As examples, the signal line(s) can be or can include niobium, tin, aluminum, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, etc.

In some embodiments, the flex circuit board 706 can include one or more vias. For instance, the vias can extend through the ground layer(s), the dielectric layer(s), and/or the signal line(s). Additionally and/or alternatively, the vias can serve to couple multiple ground layers and/or transfer signals between layers of the flex circuit board. The vias can serve to improve isolation of the signal lines. In some embodiments, the via(s) can be plated with via plate(s) that extend along the via(s). In some embodiments, the via plate(s) can be or can include conductive material, such as copper.

For instance, in some embodiments, a quantum computing system 700 can include quantum hardware 704 in data communication with one or more classical processor(s) 702. For instance, quantum hardware 704 can represent and/or manipulate information using qubits. A qubit can be or include any suitable quantum device that enables the superposition of multiple states, e.g., both the “0” and “1” state. As one example, a qubit can be or include a unit of superconducting material, such as superconducting material that achieves superconductivity at a temperature less than about 3 kelvin, such as about 1 kelvin, such as about 20 millikelvin. In some embodiments, the quantum computing system 700 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 702 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc.. The low voltage can be associated with a “0” state and the high voltage can be associated with a “1” state. The classical processor(s) 702 can be configured to, in addition to any other suitable function(s) of the classical processor(s) 702, control the quantum hardware 704. For instance, the classical processor (s) 702 can be coupled to the quantum hardware 704 (e.g., by signal lines included in flex circuit boards 706 according to example aspects of the present disclosure) and/or configured to send control signals to perform quantum operations using the quantum hardware 704. As one example, the classical processor(s) 702 can be configured to send control signals that implement quantum gate operations at the quantum hardware 704 (e.g., by control device(s)). Additionally and/or alternatively, the classical processor(s) 702 can be configured to send control signals that cause the quantum hardware 704 to perform quantum state measurements and/or provide the quantum state measurements to the classical processor(s) 702 (e.g., by readout device(s)). For example, the classical processor(s) 702 can receive measurements of the quantum system that can be interpretable by the classical processor(s) 702.

According to example aspects of the present disclosure, the quantum computing system 700 can include one or more flex circuit boards 706 including one or more signal lines. The classical processor(s) 702 can be coupled to at least one first flex circuit board. For instance, the classical processor (s) 702 can be coupled to the first flex circuit board(s) 714 by a classical-flex interconnect 732. The classical-flex interconnect 732 can convert from a classical signal transmission medium (e.g., a coaxial cable) 712 to the first flex circuit board(s) 714.

As one example, the classical-flex interconnect 732 can be or can include a compression interposer. The compression interposer can include an array (e.g., a two-dimensional array) of spring pads. A connector receiving signals from the classical processor(s) 702, such as via one or more coaxial cables 712 (e.g., one coaxial cable 712 per signal line) can be compressed against the compression interposer to form signal communications between the spring pads and the connector (e.g., the coaxial cables). The spring pads can each be coupled to a signal line on the first flex circuit board 714 such that signals can be transmitted from the classical processor(s) 702 (e.g., the coaxial cables) to the signal lines. The compression interposer can provide for connecting signal transmission media 712 having a relatively lower spatial density, such as coaxial cables, which may occupy a relatively larger amount of space per cable, to signal transmission media having a relatively higher spatial density, such as signal lines embedded in a first flex circuit board 714 provided according to example aspects of the present disclosure. Additionally, the compression interposer can achieve high isolation between signal lines and/or low reflectivity along a signal line that is/are suitable for quantum computing applications.

In some embodiments, the first flex circuit board(s) 714 can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, the first flex circuit board(s) 714 can include copper signal lines and/or ground layer(s) to provide high signal transfer performance characteristics.

The first flex circuit board(s) 714 can pass through a hermetic seal 752 positioned at an end (e.g., an entrance) of the vacuum chamber, such as cap 707. For example, a flex circuit board (e.g., first flex circuit board 714) can be configured to pass through the hermetic seal 752 such that a first portion of the flex circuit board (e.g., first flex circuit board 714) is disposed in the vacuum chamber and a second portion of the flex circuit board (e.g., first flex circuit board 714) is disposed outside of the vacuum chamber while the hermetic seal 752 forms a vacuum seal for the vacuum chamber. The hermetic seal 752 can provide for the first flex circuit board(s) 714 to enter the vacuum chamber without (e.g., substantially) destroying a vacuum created by the vacuum chamber. As one example, the hermetic seal 752 can include a fitted seal for each first flex circuit board 714. The fitted seal(s) can receive the first flex circuit board(s) 714 and form a vacuum seal with surface(s) of the first flex circuit board(s) 714. Additionally, the hermetic seal 752 can include one or more seal slots configured to receive the fitted seal(s) and/or the first flex circuit board(s) 714. For example, the fitted seal(s) can form a vacuum seal with the seal slot(s) while allowing the first flex circuit board(s) 714 to pass through the seal slot(s) and into the vacuum chamber. In this way, the flex circuit board(s) 706 can enter the vacuum chamber without experiencing signal disruptions from breaks in the circuit boards, as the boards can continuously pass into the vacuum chamber. In some embodiments, the hermetic seal 752 can include fastening systems to secure the fitted seals to the seal slots and/or form a vacuum seal, such as, for example, screws, bolts, seal rings, O rings, etc. In some embodiments, the hermetic seal 752 can form a vacuum seal without requiring adhesive material (e.g., glue, resin, etc.) such that, for example, residual adhesive material does not contaminate the flex circuit boards 706.

The first flex circuit board(s) 714 can be coupled to at least one second flex circuit board(s) 716. The first flex circuit board(s) 714 can be coupled to the second flex circuit board(s) 716 by at least one flex-flex interconnect 734. For instance, the flex-flex interconnect(s) 734 can couple (structurally and/or electrically) the ground layer(s), dielectric layer(s), and/or signal line(s) of a first flex circuit board 714 to a second flex circuit board 716. As examples, the flex-flex interconnect(s) 734 can be formed by soldering, welding, and/or otherwise fusing components of a first flex circuit board 714 to a second flex circuit board 716. The flex-flex interconnect(s) 734 can be or can include any suitable interconnection of two flex circuit board(s) 706 such as, for example, a butt joint, an overlap joint, and/or any other suitable interconnection(s).

The second flex circuit board(s) 716 can have at least a different material composition from the first flex circuit board(s) 714. In some embodiments, the second flex circuit board(s) 716 can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, the second flex circuit board(s) 716 can include copper alloy signal lines and/or ground layer(s) to provide reduced thermal conductivity from the upper portions of the vacuum chamber (e.g., first circuit boards 714) and/or dispelling heat produced at subsequent components, such as surface mount attenuators 754.

In some embodiments, the second flex circuit board(s) 716 can be coupled to at least one surface mount attenuator board 718. For instance, the second flex circuit board(s) 716 can be coupled to the surface mount attenuator board(s) 718 by at least one flex-flex interconnect 736. For instance, the flex-flex interconnect(s) 736 can couple (structurally and/or electrically) the ground layer(s), dielectric layer(s), and/or signal line(s) of a second flex circuit board 716 to a surface mount attenuator board 718. As examples, the flex-flex interconnect(s) 736 can be formed by soldering, welding, and/or otherwise fusing components of a second flex circuit board 716 to a surface mount attenuator board 718. The flex-flex interconnect(s) 736 can be or can include any suitable interconnection of two flex circuit board(s) 706 such as, for example, a butt joint, an overlap joint, and/or any other suitable interconnection(s).

The surface mount attenuator board 718 can be a flexible printed circuit board. In some embodiments, the surface mount attenuator board(s) 718 can be or can include a surface mount attenuator board material at the ground layer (s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board can include copper signal lines and/or ground layer(s) to provide high signal transfer performance characteristics.

The surface mount attenuator board(s) 718 can include one or more surface mount attenuators 754. The surface mount attenuator(s) 754 can be configured to attenuate or block thermal photon interference. In some embodiments, the surface mount attenuator board(s) 718 and/or the surface mount attenuator(s) 754 can be placed at a temperature cold enough such that the surface mount attenuator(s) 754 do not produce thermal photons. In some embodiments, the surface mount attenuator(s) 754 can be disposed in an isolation plate. The isolation plate can be configured to isolate the one or more surface mount attenuators. The isolation plate can be attached to the surface mount attenuator board(s) 718. In some embodiments, the isolate plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block cross-talk between attenuators.

The quantum computing system 700 can include at least one third flex circuit board 720. For instance, the surface mount attenuator board(s) 718 can be coupled to the third flex circuit board(s) 720 by at least one flex-flex interconnect 738. For instance, the flex-flex interconnect(s) 738 can couple (structurally and/or electrically) the ground layer(s), dielectric layer(s), and/or signal line(s) of a surface mount attenuator board 718 to a third flex circuit board 720. As examples, the flex-flex interconnect(s) 738 can be formed by soldering, welding, and/or otherwise fusing components of a surface mount attenuator board 718 to a third flex circuit board 720. The flex-flex interconnect(s) 738 can be or can include any suitable interconnection of two flex circuit board(s) 706 such as, for example, a butt joint, an overlap joint, and/or any other suitable interconnection(s).

The third flex circuit board(s) 720 can be positioned at a point in the vacuum chamber at which the cooling gradient is cool enough such that some materials exhibit superconductivity. For example, at least a portion of the third flex circuit board(s) 720 can have a temperature of less than about three kelvin.

In some embodiments, the third flex circuit board(s) 720 can be or can include a third flex circuit board material at the ground layer(s) and/or the signal line(s). The third flex circuit board(s) 720 material can be selected to be superconducting at a temperature which at least a portion of the third flex circuit board(s) 720 experiences superconductivity. As examples, the third flex circuit board(s) 720 material can be or can include niobium, tin, aluminum, and/or other suitable superconducting materials. For instance, the third flex circuit board(s) 720 can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by a thin layer of copper to prevent the formation of oxides, then a thicker layer of copper.

In some embodiments, the third flex circuit board(s) 720 can be coupled to at least one fourth flex circuit board 722. The third flex circuit board(s) 720 can be coupled to the fourth flex circuit board(s) 722 by at least one flex-flex interconnect 740. For instance, the flex-flex interconnect(s) 740 can couple (structurally and/or electrically) the ground layer(s), dielectric layer(s), and/or signal line(s) of a third flex circuit board 720 to a fourth flex circuit board 722. As examples, the flex-flex interconnect(s) 740 can be formed by soldering, welding, and/or otherwise fusing components of a third flex circuit board 720 to a fourth flex circuit board 722. The flex-flex interconnect(s) 740 can be or can include any suitable interconnection of two flex circuit board(s) 706 such as, for example, a butt joint, an overlap joint, and/or any other suitable interconnection(s).

The fourth flex circuit board(s) 722 can couple the third flex circuit board(s) 720 to the quantum hardware 704. For example, a connector 742 at an end of the fourth flex circuit board(s) 722 can attach to a port that is in signal communication with the quantum hardware 704. As one example, the connector can be a T-joint connector, such as a T-joint connector including superconducting materials (e.g., tin). Additionally and/or alternatively, the connector 742 may be a planar spring array.

In some embodiments, the fourth flex circuit board(s) 722 can be or can include a fourth flex circuit board material at the ground layer(s) and/or the signal line(s). The fourth flex circuit board(s) 722 material can be selected to provide high signal transfer performance characteristics. As examples, the fourth flex circuit board(s) 722 material can be or can include copper, brass, gold, and/or other suitable materials having high signal transfer performance characteristics. For instance, the fourth flex circuit board(s) 722 can include copper signal lines and/or ground layer(s) to provide high signal transfer performance characteristics. Additionally and/or alternatively, the fourth flex circuit board(s) 722 material can be selected to be superconducting at a temperature at which at least a portion of the fourth flex circuit board(s) 722 operates. As examples, the fourth flex circuit board(s) 722 material can be or can include niobium, tin, aluminum, and/or other suitable superconducting materials.

In some embodiments, the fourth flex circuit board(s) 722 can be or can include a filter 756, such as an XYZ and/or IR filter 756. For instance, the filter 756 can be configured to reduce effects of noise, thermal photons, and/or other potential sources of interference. As one example, the filter 756 can include a cavity in the fourth flex circuit board(s) 722 that is filled with a filter material, such as a particulate suspension, to provide XYZ/IR filtering. In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

In some embodiments, the filter 756 can be bounded by one or more boundaries of a cavity within the fourth flex circuit board(s) 722 (e.g., a cavity within the dielectric material). For instance, a cavity within the fourth flex circuit board(s) 722 can be filled with a filter material (e.g., a magnetically loaded polymer). In some embodiments, the cavity can be filled (e.g., partially or completely) with filter material via an access within the fourth flex circuit board(s) 722 when the filter material is in any pourable, injectable, and/or moldable state (e.g., flowing particulates, soft/plasticized materials, gels, slurries, pastes, foams, uncured thermosets, softened/melted thermoplastics, etc.). In some embodiments, the cavity can be filled with the filter material in a substantially solid state (e.g., by press-fitting into the cavity, etc.).

Figure 8:
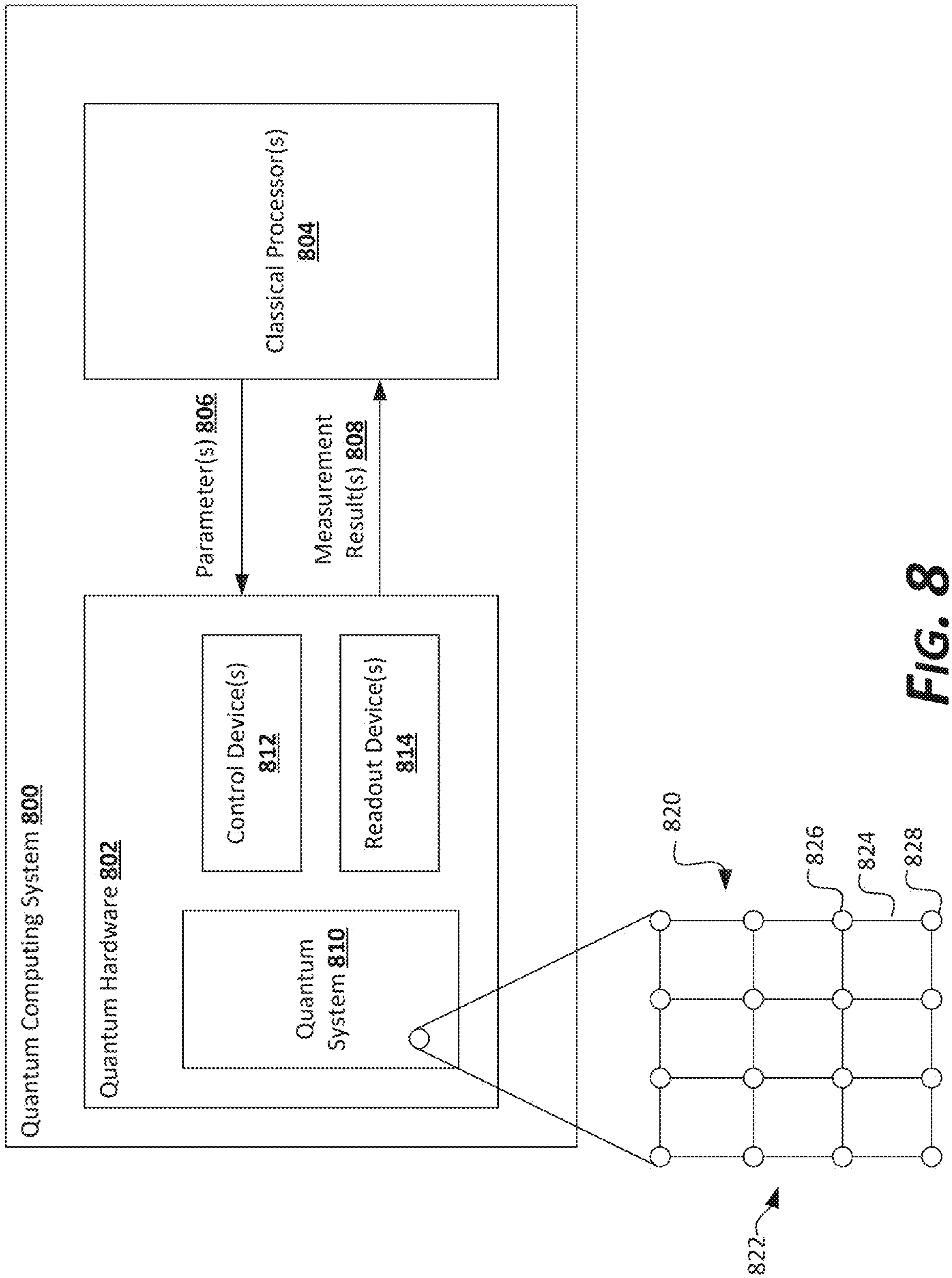
FIG. 8 depicts an example of a quantum computing system according to example aspects of the present disclosure.

FIG. 8 depicts an example quantum computing system 800. The example system 800 is an example of a system on one or more classical computers or quantum computing devices in one or more locations, in which the systems, components, and techniques described below can be implemented. Those of ordinary skill in the art, using the disclosures provided herein, will understand that other quantum computing structures or systems can be used without deviating from the scope of the present disclosure.

The system 800 includes quantum hardware 802 in data communication with one or more classical processors 804. The quantum hardware 802 includes components for performing quantum computation. For example, the quantum hardware 102 includes a quantum system 810, control device(s) 812, and readout device(s) 814 (e.g., readout resonator(s)). The quantum system 810 can include one or more multi-level quantum subsystems, such as a register of qubits. In some implementations, the multi-level quantum subsystems can include superconducting qubits, such as flux qubits, charge qubits, transmon qubits, gmon qubits, etc.

The type of multi-level quantum subsystems that the system 800 utilizes may vary. For example, in some cases it may be convenient to include one or more readout device(s) 814 attached to one or more superconducting qubits, e.g., transmon, flux, gmon, xmon, or other qubits. In other cases, ion traps, photonic devices or superconducting cavities (e.g., with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 810 via multiple control lines that are coupled to one or more control devices 812. Example control devices 812 that operate on the register of qubits can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 812 may be configured to operate on the quantum system 810 through one or more respective control parameters (e.g., one or more physical control parameters). For example, in some implementations, the multi-level quantum subsystems may be superconducting qubits and the control devices 812 may be configured to provide control pulses to control lines to generate magnetic fields to adjust the frequency of the qubits.

The quantum hardware 802 may further include readout devices 814 (e.g., readout resonators). Measurement results 808 obtained via measurement devices may be provided to the classical processors 804 for processing and analyzing. In some implementations, the quantum hardware 802 may include a quantum circuit and the control device(s) 812 and readout devices(s) 814 may implement one or more quantum logic gates that operate on the quantum system 802 through physical control parameters (e.g., microwave pulses) that are sent through wires included in the quantum hardware 802.

Further examples of control devices include arbitrary waveform generators, wherein a DAC (digital to analog converter) creates the signal.

The readout device(s) 814 may be configured to perform quantum measurements on the quantum system 810 and send measurement results 808 to the classical processors 804. In addition, the quantum hardware 802 may be configured to receive data specifying physical control qubit parameter values 806 from the classical processors 804. The quantum hardware 802 may use the received physical control qubit parameter values 806 to update the action of the control device(s) 812 and readout devices(s) 814 on the quantum system 810. For example, the quantum hardware 802 may receive data specifying new values representing voltage strengths of one or more DACs included in the control devices 812 and may update the action of the DACs on the quantum system 810 accordingly. The classical processors 804 may be configured to initialize the quantum system 810 in an initial quantum state, e.g., by sending data to the quantum hardware 802 specifying an initial set of parameters 806.

The readout device(s) 814 can take advantage of a difference in the impedance for the ¿ 0〉 and ¿ 1〉 states of an element of the quantum system, such as a qubit, to measure the state of the element (e.g., the qubit). For example, the resonance frequency of a readout resonator can take on different values when a qubit is in the state ¿ 0〉 or the state ¿ 1〉, due to the nonlinearity of the qubit. Therefore, a microwave pulse reflected from the readout device 814 carries an amplitude and phase shift that depend on the qubit state. In some implementations, a Purcell filter can be used in conjunction with the readout device(s) 814 to impede microwave propagation at the qubit frequency.

In some implementations, the quantum system 810 can include a plurality of qubits 820 arranged, for instance, in a two-dimensional grid 822. For clarity, the two-dimensional grid 822 depicted in FIG. 8 includes 16 qubits arranged in a square formation, however in some implementations the system 810 may include a smaller or a larger number of qubits. In some embodiments, the multiple qubits 820 can interact with each other through multiple qubit couplers, e.g., qubit coupler 824. The qubit couplers can define nearest neighbor interactions between the multiple qubits 820. In some implementations, the strengths of the multiple qubit couplers are tunable parameters. In some cases, the multiple qubit couplers included in the quantum computing system 800 may be couplers with a fixed coupling strength. In some implementations, the multiple qubits 820 may include data qubits, such as qubit 826 and measurement qubits, such as qubit 828. A data qubit is a qubit that participates in a computation being performed by the system 800. A measurement qubit is a qubit that may be used to determine an outcome of a computation performed by the data qubit. That is, during a computation an unknown state of the data qubit is transferred to the measurement qubit using a suitable physical operation and measured via a suitable measurement operation performed on the measurement qubit.

In some implementations, each qubit in the multiple qubits 820 can be operated using respective operating frequencies, such as an idling frequency and/or an interaction frequency and/or readout frequency and/or reset frequency. The operating frequencies can vary from qubit to qubit. For instance, each qubit may idle at a different operating frequency. The operating frequencies for the qubits 820 can be chosen before a computation is performed by the calibration system. Some operating frequencies are better than other operating frequencies. One metric for assessing how good a particular operating frequency is for a particular qubit is energy relaxation time (T1) for the qubit at the frequency. Lower energy relaxation times can lead to larger quantum computational errors.

In various implementations, the example system 800 can be implemented as a client device, a server device, or both. The example system 800 can be implemented as part of a distributed computing system. The example system 800 can be implemented along with other example systems, which may be the same or different. The example system 800 can be implemented in a server farm or other facility that operates multiple computing systems to provide computational services to or on behalf of a plurality of client systems. Advantageously, techniques according to example aspects of the present disclosure can provide for improved calibration and maintenance of computing facilities, increasing service uptime, decreasing failure rates, etc.

Example Methods

Figure 9:
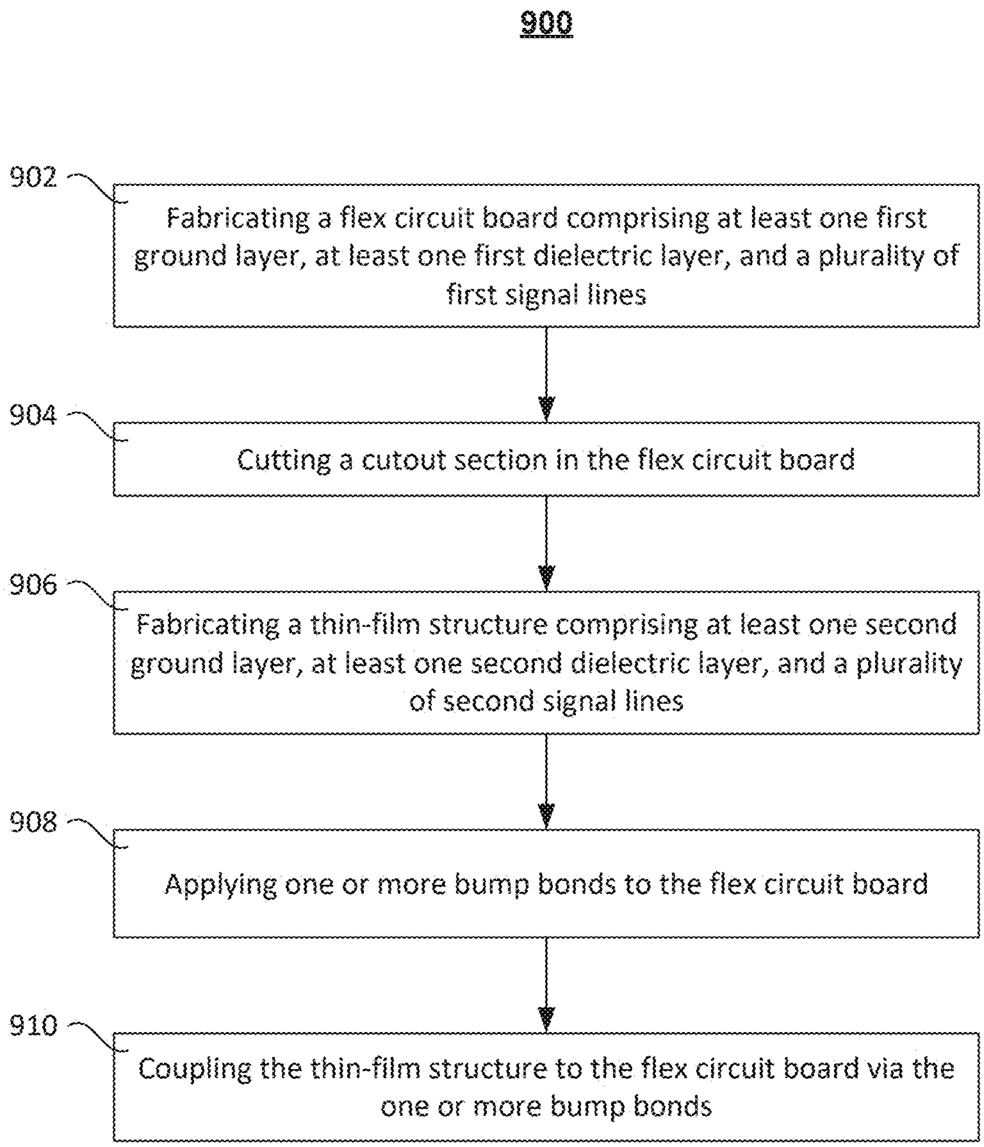
FIG. 9 depicts a flowchart diagram of an example fabrication method for fabricating signal line assemblies according to some aspects of the present disclosure.

FIG. 9 depicts a flowchart diagram of an example method for fabricating a flex circuit board comprising one or more thin-film components according to example embodiments of the present disclosure. Although FIG. 9 depicts steps performed in a particular order for purposes of illustration and discussion, the methods of the present disclosure are not limited to the particularly illustrated order or arrangement. The various steps of example method 900 can be omitted, rearranged, combined, and/or adapted in various ways without deviating from the scope of the present disclosure.

At 902, example method 900 can include fabricating a flex circuit board (e.g., flex circuit board 100, 200, 400, etc.) comprising at least one first ground layer, at least one first dielectric layer, and a plurality of first signal lines. In some instances, example method 900 at 902 can include using one or more systems or performing one or more activities described with respect to FIGS. 1-6.

At 904, example method 900 can include cutting a cutout section (e.g., cutout 210) in the flex circuit board. In some instances, example method 900 at 904 can include using one or more systems or performing one or more activities described with respect to FIG. 2.

At 906, example method 900 can include fabricating a thin-film structure (e.g., thin-film structure 312) comprising at least one second ground layer (e.g., ground layer 502), at least one second dielectric layer (e.g., dielectric layer 504), and a plurality of second signal lines (e.g., signal lines 306). In some instances, example method 900 at 906 can include using one or more systems or performing one or more activities described with respect to FIGS. 3-6.

At 908, example method 900 can include applying one or more bump bonds (e.g., bump bonds 420, etc.) to the flex circuit board. In some instances, example method 900 at 908 can include using one or more systems or performing one or more activities described with respect to FIGS. 4-5.

At 910, example method 900 can include coupling the thin-film structure to the flex circuit board via the one or more bump bonds. In some instances, example method 900 at 910 can include using one or more systems or performing one or more activities described with respect to FIGS. 4-5.

Figure 10:
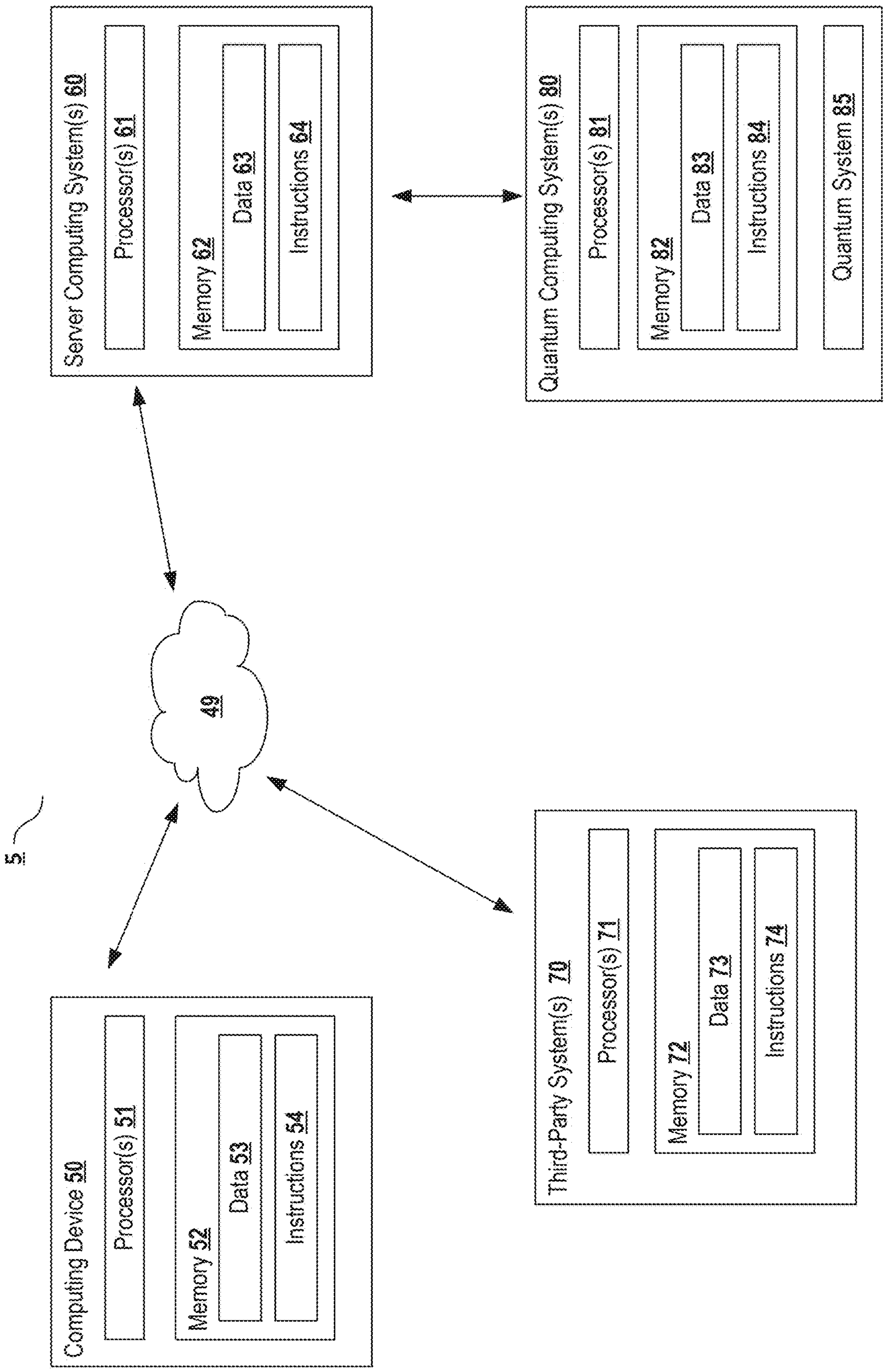
FIG. 10 depicts a block diagram of an example computing system according to example aspects of the present disclosure.

FIG. 10 depicts a block diagram of an example computing system 5 that can perform aspects of example embodiments of the present disclosure. The system 5 includes a computing device 50, a server computing system 60, and a third-party system 70 that are communicatively coupled over a network 49. The system 5 also includes a quantum computing system 80 that is communicatively coupled to the server computing system.

The computing device 50 can be any type of computing device (e.g., classical computing device), such as, for example, a mobile computing device (e.g., smartphone or tablet), a personal computing device (e.g., laptop or desktop), a workstation, a cluster, a gaming console or controller, a wearable computing device, an embedded computing device, or any other type of computing device. In some embodiments, the computing device 50 can be a client computing device or a server computing device. The computing device 50 can include one or more processors 51 and a memory 52. The one or more processors 51 can be any suitable processing device (e.g., a processor core, a microprocessor, an ASIC, an FPGA, a controller, a microcontroller, etc.) and can be one processor or a plurality of processors that are operatively connected. The memory 52 can include one or more non-transitory computer-readable storage media, such as RAM, ROM, EEPROM, EPROM, flash memory devices, magnetic disks, etc., and combinations thereof. The memory 52 can store data 53 and instructions 54 which are executed by the processor 51 to cause the user computing device 50 to perform operations as described herein.

The computing device 50 can also include one or more input components that receive user input. For example, a user input component can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

The quantum computing system 80 can include one or more processors 81 (e.g., classical processor(s) 804) and a memory 82. The one or more processors 81 can be any suitable processing device (e.g., a processor core, a microprocessor, an ASIC, an FPGA, a controller, a microcontroller, etc.) and can be one processor or a plurality of processors that are operatively connected. The memory 82 can include one or more non-transitory computer-readable storage media, such as RAM, ROM, EEPROM, EPROM, flash memory devices, magnetic disks, etc., and combinations thereof. The memory 82 can store data 83 and instructions 84 which are executed by the processor 81 to cause the quantum computing system 80 to perform operations as described herein.

The quantum computing system 80 can also include a quantum system 85 for performing quantum computations. In some instances, the quantum system 85 can be, comprise, or be comprised by quantum hardware 802, described above with reference to FIG. 8.

In some implementations, the quantum computing system can 80 include or be otherwise implemented by one or more server computing systems 60. In instances in which the quantum computing system 80 includes plural server computing devices, such server computing devices can operate according to sequential computing architectures, parallel computing architectures, or some combination thereof.

The third-party system 70 can include one or more processors 71 and a memory 72. The one or more processors 71 can be any suitable processing device (e.g., a processor core, a microprocessor, an ASIC, an FPGA, a controller, a microcontroller, etc.) and can be one processor or a plurality of processors that are operatively connected. The memory 72 can include one or more non-transitory computer-readable storage media, such as RAM, ROM, EEPROM, EPROM, flash memory devices, magnetic disks, etc., and combinations thereof. The memory 72 can store data 73 and instructions 74 which are executed by the processor 71 to cause the third-party system 70 to perform operations. In some implementations, the third-party system 70 includes or is otherwise implemented by one or more server computing devices.

The server computing system 60 can include one or more processors 61 and a memory 62. The one or more processors 61 can be any suitable processing device (e.g., a processor core, a microprocessor, an ASIC, an FPGA, a controller, a microcontroller, etc.) and can be one processor or a plurality of processors that are operatively connected. The memory 62 can include one or more non-transitory computer-readable storage media, such as RAM, ROM, EEPROM, EPROM, flash memory devices, magnetic disks, etc., and combinations thereof. The memory 62 can store data 63 and instructions 64 which are executed by the processor 61 to cause the server computing system 60 to perform operations. In some implementations, the server computing system 60 includes or is otherwise implemented by one or more server computing devices.

The network 49 can be any type of communications network (e.g., classical or quantum), such as a local area network (e.g., intranet), wide area network (e.g., Internet), or some combination thereof and can include any number of wired or wireless links. In general, communication over the network 49 can be carried via any type of wired or wireless connection, using a wide variety of communication protocols (e.g., TCP/IP, HTTP, SMTP, FTP), encodings or formats (e.g., HTML, XML), or protection schemes (e.g., VPN, secure HTTP, SSL).

FIG. 10 illustrates one example computing system that can be used to implement the present disclosure. Other computing systems can be used as well. For example, in some implementations, the quantum computing system 80 can include the server computing system 60 or vice versa. In some implementations, the quantum computing system 80 may be communicatively coupled through the network 49 to the computing device 50, third-party system 70, or server computing system 60.

Implementations of the digital, classical, and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs (e.g., one or more modules of digital and/or quantum computer program instructions encoded on a tangible non-transitory storage medium for execution by, or to control the operation of, data processing apparatus). The digital and/or quantum computer storage medium can be a machine-readable storage device, a machine-readable storage substrate, a random or serial access memory device, one or more qubits/qubit structures, or a combination of one or more of them.

Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit (i.e., a system that defines the unit of quantum information). It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qubits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc..

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more tangible, non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

Aspects of the disclosure have been described in terms of illustrative implementations thereof. Numerous other implementations, modifications, or variations within the scope and spirit of the appended claims can occur to persons of ordinary skill in the art from a review of this disclosure. Any and all features in the following claims can be combined or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein, with "or" being understood as "and/or" unless otherwise indicated. Also, terms such as "based on" should be understood as "based at least in part on."

Those of ordinary skill in the art, using the disclosures provided herein, will understand that the elements of any of the claims, operations, or processes discussed herein can be adapted, rearranged, expanded, omitted, combined, or modified in various ways without deviating from the scope of the present disclosure. Some of the claims are described with a letter reference to a claim element for exemplary illustrated purposes and is not meant to be limiting. The letter references do not imply a particular order of operations. For instance, letter identifiers such as (a), (b), (c), . . . , (i), (ii), (iii), . . . , etc. can be used to illustrate operations. Such identifiers are provided for the ease of the reader and do not denote a particular order of steps or operations. An operation illustrated by a list identifier of (a), (i), etc. can be performed before, after, or in parallel with another operation illustrated by a list identifier of (b), (ii), etc.

What is claimed is:

1. A signal line assembly comprising:

a flex circuit board comprising:

at least one first ground layer;

at least one first dielectric layer disposed on an inner surface of the at least one first ground layer, the first dielectric layer having a first thickness; and a plurality of first signal lines disposed on an inner surface of the at least one first dielectric layer;

wherein the flex circuit board comprises at least one cutout section; and at least one film structure disposed in the cutout section, the film structure comprising:

at least one second ground layer;

at least one second dielectric layer having a second thickness that is smaller than the first thickness; and a plurality of second signal lines respectively coupled to the plurality of first signal lines.

2. The signal line assembly of claim 1, wherein a total thickness of the film structure is less than 100 micrometers.

3. The signal line assembly of claim 1, wherein a ratio of the first thickness to the second thickness is greater than four.

4. The signal line assembly of claim 1, wherein the film structure further comprises one or more filters.

5. The signal line assembly of claim 4, wherein the one or more filters comprise one or more photolithographically defined filter structures.

6. The signal line assembly of claim 1, wherein the film structure comprises one or more materials configured to attenuate infrared signals.

7. The signal line assembly of claim 1, wherein the cutout section comprises an edge frame.

8. The signal line assembly of claim 7, wherein the edge frame lacks any metal components.

9. The signal line assembly of claim 1, wherein at least one signal line of the plurality of second signal lines comprises a superconducting material.

10. The signal line assembly of claim 9, wherein the superconducting material has a critical temperature less than 3 Kelvin.

11. The signal line assembly of claim 1, further comprising:

one or more vias electrically connecting a surface of the flex circuit board to one or more first signal lines of the plurality of first signal lines.

12. The signal line assembly of claim 11, wherein the one or more vias are electrically coupled to one or more second signal lines of the plurality of second signal lines via one or more bump bonds.

13. The signal line assembly of claim 1, wherein the at least one second dielectric layer comprises a polyimide film.

14. The signal line assembly of claim 1, wherein at least one second signal line of the plurality of second signal lines comprises a first electrically conductive material and a barrier layer comprising a second material different from the first electrically conductive material.

15. The signal line assembly of claim 1, wherein the film structure further comprises one or more attenuators.

16. The signal line assembly of claim 1, wherein the film structure further comprises one or more thermalization structures.

17. A quantum computing system comprising:

a plurality of qubits;

a quantum logic circuit configured to perform one or more quantum operations on the plurality of qubits; and a signal line assembly comprising:

a flex circuit board comprising:

at least one first ground layer;

at least one first dielectric layer disposed on an inner surface of the at least one first ground layer, the first dielectric layer having a first thickness; and a plurality of first signal lines disposed on an inner surface of the at least one first dielectric layer;

wherein the flex circuit board comprises at least one cutout section; and at least one film structure disposed in the cutout section, the film structure comprising:

at least one second ground layer;

at least one second dielectric layer having a second thickness that is smaller than the first thickness; and a plurality of second signal lines respectively coupled to the plurality of first signal lines.

18. A method for fabricating a signal line assembly, comprising:

fabricating a flex circuit board comprising:

at least one first ground layer;

at least one first dielectric layer disposed on an inner surface of the at least one first ground layer, the first dielectric layer having a first thickness; and a plurality of first signal lines disposed on an inner surface of the at least one first dielectric layer;

wherein the flex circuit board comprises at least one cutout section;

fabricating a film structure comprising:

at least one second ground layer;

at least one second dielectric layer having a second thickness that is smaller than the first thickness; and a plurality of second signal lines respectively coupled to the plurality of first signal lines;

applying one or more bump bonds to the flex circuit board; and coupling the film structure to the flex circuit board via the one or more bump bonds.

19. The method of claim 18, wherein the flex circuit board comprises one or more vias electrically connecting a surface of the flex circuit board to one or more first signal lines of the plurality of first signal lines, and wherein the one or more bump bonds electrically couple the one or more vias to one or more second signal lines of the plurality of second signal lines.

20. The method of claim 18, wherein the film structure comprises one or more filters, and fabricating the one or more filters comprises photolithographically defining the one or more filters.

* * * * *